(12) United States Patent
Harada et al.

(10) Patent No.: US 7,666,572 B2
(45) Date of Patent: Feb. 23, 2010

(54) RESIST TOP COAT COMPOSITION AND PATTERNING PROCESS

(75) Inventors: Yuji Harada, Niigata (JP); Jun Hatakeyama, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 80 days.

(21) Appl. No.: 11/808,543

(22) Filed: Jun. 11, 2007

(65) Prior Publication Data

US 2007/0298355 A1 Dec. 27, 2007

(30) Foreign Application Priority Data

Jun. 27, 2006 (JP) ............................. 2006-176947

(51) Int. Cl.
G03F 7/09 (2006.01)
G03F 7/20 (2006.01)
G03F 7/30 (2006.01)
G03C 1/76 (2006.01)

(52) U.S. Cl. ................. 430/270.1; 430/273.1; 430/325; 430/326; 430/905; 430/907

(58) Field of Classification Search .................. None
See application file for complete search history.

(56) References Cited

U.S. PATENT DOCUMENTS

2006/0094817 A1* 5/2006 Harada et al. ............... 524/544

FOREIGN PATENT DOCUMENTS

| JP | A 60-38821 | 2/1985 |
|---|---|---|
| JP | A 62-62520 | 3/1987 |
| JP | A 62-62521 | 3/1987 |
| JP | A 5-74700 | 3/1993 |
| JP | A 6-273926 | 9/1994 |
| JP | A 7-181685 | 7/1995 |
| JP | A 9-246173 | 9/1997 |
| JP | B2 2803549 | 7/1998 |
| JP | 2003-301006 | * 10/2003 |

OTHER PUBLICATIONS

Machine-assisted English translation of JP 2003-301006 as provided by JPO.*
Fedynyshyn, Theodore H., "Advances In Resist Technology and Processing XIX," Proceedings of SPIE, vol. 4690, pp. iii-xlii, Mar. 4-6, 2002.
Owa, Soichi et al., "Immersion Lithography; Its Potential Performance and Issues," Optical Microlithography XVI, Proceedings Of SPIE, vol. 5040, pp. 724-733, 2003.
Hirayama, Taku, "Resist And Cover Material Investigation for Immersion Lithography," 2nd Immersion Workshop, Jul. 11, 2003.
Allen, Robert D. et al., "Design of Protective Topcoats For Immersion Lithography," Journal of Photopolymer Science and Technology. vol. 18, No. 5, pp. 615-619, 2005.
Murase, H. et al., "Neuer Begriff Und Ein Nano-Hybrid System Fur Hydrophobie," XXIV FATIPEC Congress Book, vol. B, pp. B-15-B-38, 1997 (with abstract).
Murase, Heihachi et al., "Characterization Of Molecular Interfaces in Hydrophobic Systems," Progress in Organic Coating, vol. 31, pp. 97-104, 1997.

* cited by examiner

*Primary Examiner*—Sin J. Lee
(74) *Attorney, Agent, or Firm*—Oliff & Berridge, PLC

(57) ABSTRACT

There is disclosed a resist top coat composition, comprising at least a polymer that has an amino group or a sulfonamide group at a polymer end and that is represented by the following general formula (1); and a patterning process comprising: at least, a step of forming a photoresist film on a substrate; a step of forming a resist top coat on the photoresist film by using the resist top coat composition; a step of exposing the substrate; and a step of developing the substrate with a developer. There can be provided a resist top coat composition that makes it possible to provide more certainly rectangular and excellent resist patterns when a top coat is formed on a photoresist film; and a patterning process using such a composition.

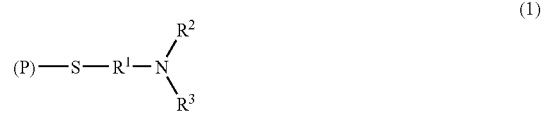

(1)

25 Claims, No Drawings

RESIST TOP COAT COMPOSITION AND PATTERNING PROCESS

BACKGROUND OF THE INVENTION

1. Field of the Invention

The present invention relates to a resist top coat composition for forming a top coat on a photoresist film for the purpose of protecting the photoresist film in photolithography for micropatterning processes in manufacturing processes of semiconductor devices and so on, for example, in the liquid immersion photolithography in which ArF excimer laser having a wavelength of 193 nm is used as a light source and liquid such as water is inserted in a gap between a projection lens and a substrate; and to a patterning process using the resist top coat composition.

2. Description of the Related Art

There has been increasingly achieved a finer pattern rule along with a tendency in which integration and speed of LSIs have become higher in recent years. This is based on use of shorter wavelength exposure light sources. For example, use of a shorter wavelength of KrF excimer laser (248 nm) instead of i line (365 nm) of a mercury-vapor lamp has allowed mass production of a 64 M bit (a processing dimension of 0.25 µm or less) DRAM (dynamic random access memory).

Furthermore, in order to manufacture DRAM with an integration of 256M, 1 G or more, the lithography using ArF excimer laser (193 nm) has been earnestly examined, and fabrication of 65 nm node devices has been examined with combination of ArF lithography and a lens having an enhanced NA of 0.9 or higher.

As for fabrication of the next 45 nm node devices, use of $F_2$ laser having a wavelength of 157 nm was suggested to be a possible choice. However, introduction of $F_2$ lithography has been postponed due to many problems represented by a detriment in cost, underperforming resists, and the like. And then as an alternative of the $F_2$ lithography, ArF liquid immersion lithography has been suggested. And the ArF liquid immersion lithography has been developed for the purpose of early introduction of it (See Proc. SPIE Vol. 4690(2002) xxix).

In the ArF liquid immersion lithography, a gap between a projection lens and a wafer is filled with liquid such as water, ArF excimer laser is irradiated via the liquid. Water has an index of refraction of 1.44 with 193 nm light, and a pattern can be formed even with using a lens having an NA of 1.0 or more. In theory, NA can be increased up to 1.44. Resolution is enhanced by increment of NA. It is suggested that combination of a lens having an NA of 1.2 or more and ultra resolution techniques may realize fabrication of 45 nm node devices (See Proc. SPIE Vol. 5040 (2003) p 724).

However, conducting exposure with the presence of water on a photoresist film causes leaching of a part of generated acid and a basic compound added to the resist film to the water layer. As a result, this can cause pattern deformation or pattern collapse. In addition, it has also been pointed out that small amounts of water droplets remaining on the resist film can penetrate the resist film to cause defects. In order to solve the above-mentioned drawbacks, it has been suggested that in the ArF liquid immersion lithography, a top coat is placed between the resist film and water (For example, see 2nd Immersion Work Shop: Resist and Cover Material Investigation for Immersion Lithography (2003)).

The top coat that is formed on a photoresist film has been investigated as an antireflection film represented by the ARCOR (antireflective coating on resist) method (For example, see Japanese Unexamined Patent Application Publication No. 62-62520, No. 62-62521, and No. 60-38821).

The ARCOR method includes a step of forming a transparent antireflective coating on a photoresist film and removing the antireflective coating after exposure. In this case, use of compositions having a low refractive index such as perfluoro alkyl polyethers or perfluoro alkyl amines as a resist top coat composition reduces remarkably reflection at the photoresist film/resist top coat interface, thereby enhancing dimensional accuracy. Then as examples of such a resist top coat composition, there has been suggested amorphous polymers such as perfluoro (2,2-dimethyl-1,3-dioxol)-tetrafluoroethylene copolymer (For example, see Japanese Unexamined Patent Application Publication No. 05-74700).

However, such fluorine-containing compounds have a low compatibility with organic compounds, and flon solvents are used for applying and stripping top coats, thereby having major drawbacks in terms of environment and cost.

Other than the above resist top coat compositions, applications of water-soluble or alkali-soluble compositions have been examined (For example, see Japanese Unexamined Patent Application Publication No. 06-273926, Japanese Patent Publication No. 2803549, and J. Photopolymer Sci. and Technol. Vol. 18, No. 5 p. 615 (2005)).

However, water-soluble top coats cannot be used for the ArF liquid immersion lithography because liquid such as water overlies a top coat. On the other hand, alkali-soluble resist top coat compositions have a major advantage in terms of cost because the compositions are strippable with alkaline developers and no additional installation of a unit for stripping the top coat is required. Based on the above-mentioned viewpoints, water-insoluble and alkali-soluble resist top coat compositions have been earnestly developed. For example, there has been suggested a resist top coat composition using a methacrylate resin having a fluorine-containing alcohol in a side chain.

As for properties required for resist top coat compositions, there are not only a property to prevent leaching of a generated acid or a basic compound in a photoresist film into water but also water repellent property and water-sliding property. Among these properties, it has been reported that the water repellent property is effectively enhanced by introducing fluorine to a resin, and that the water-sliding property is effectively enhanced by forming micro domain structures in combination of different water repellent groups (For example, see XXIV FATIPEC Congress Book, Vol. B, p. 15(1997); and Progress in Organic Coatings, 31, p. 97 (1997)).

By the way, in the above cases, there can occur problems depending on the types of photoresist films that when a resist top coat is formed on a photoresist film, film loss occurs in the surface portions of developed photoresist film and the photoresist film has a rounded top shape. In this case, rectangular and excellent resist patterns cannot be obtained. Therefore, there has been demanded a resist top coat composition that more certainly provides rectangular and excellent resist patterns.

SUMMARY OF THE INVENTION

The present invention has been accomplished to solve the above-mentioned problems, and an object of the present invention is to provide a resist top coat composition that makes it possible to provide more certainly rectangular and excellent resist patterns when a top coat is formed on a photoresist film; and a patterning process using such a composition.

In order to achieve the above object, the present invention provides a resist top coat composition, comprising at least a polymer that has an amino group or a sulfonamide group at a polymer end and that is represented by the following general formula (1),

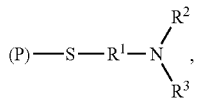

(1)

wherein the (P) represents a unit obtained by polymerization of a polymerizable compound;

$R^1$ represents a single bond or a linear, branched or cyclic alkylene group having 1-10 carbon atoms;

$R^2$ and $R^3$ independently represent any one of a hydrogen atom, a linear, branched or cyclic alkyl group having 1-20 carbon atoms, and $-SO_2R^4$;

either $R^1$ and $R^2$, $R^1$ and $R^3$, or $R^2$ and $R^3$ may be linked to form a ring; and $R^4$ represents any one of a linear, branched or cyclic alkyl group having 1-10 carbon atoms and an aryl group having 6-20 carbon atoms; the alkyl group and the aryl group may contain one or more groups selected from an ether group and an ester group; and hydrogen atoms of the alkyl group and the aryl group may be totally or partially substituted with a fluorine atom.

As mentioned above, when a top coat is formed on a photoresist film, depending on the types of the photoresist films, there are problems that film loss occurs in the surface portions of the developed photoresist film and the photoresist film on which a resist pattern is formed has a rounded top shape. The cause of the problems is considered that amine compounds added to the photoresist film migrates to the overlying top coat. Against the problems, the resist top coat composition according to the present invention comprises a polymer that has an amino group or a sulfonamide group at a polymer end and that is represented by the general formula (1). Therefore, forming a top coat on a photoresist film by using the composition makes it possible to effectively prevent the amine compound from migrating from the photoresist film. For example, it becomes possible to more certainly prevent film loss in the surface portions of developed photoresist film. Consequently, rectangular and excellent resist patterns can be obtained more certainly.

In addition, in the resist top coat composition according to the present invention, the unit (P) of the polymer represented by the general formula (1) preferably comprises a repeating unit represented by the following general formula (2),

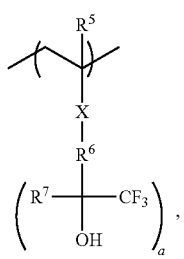

(2)

wherein $R^5$ represents any one of a hydrogen atom, a fluorine atom, a methyl group, and a trifluoromethyl group;

X represents any one of a single bond, $-O-$, $-C(=O)-O-$, $-C(=O)-O-R^{14}-C(=O)-O-$, $-C(=O)-O-R^{14}-O-$, and $-C(=O)-O-R^{14}-O-C(=O)-$;

$R^{14}$ represents a linear, branched or cyclic alkylene group having 1-10 carbon atoms;

$R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom;

$R^7$ represents any one of a hydrogen atom, a fluorine atom, a methyl group, a trifluoromethyl group, and a difluoromethyl group;

$R^6$ and $R^7$ may be linked to form a ring, and the ring may contain an ether bond; and a is 1 or 2.

In addition, in the resist top coat composition according to the present invention, the unit (P) of the polymer represented by the general formula (1) preferably comprises a repeating unit represented by the following general formula (3),

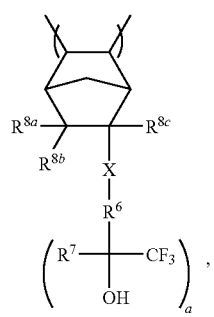

(3)

wherein X represents any one of a single bond, $-O-$, $-C(=O)-O-$, $-C(=O)-O-R^{14}-C(=O)-O-$, $-C(=O)-O-R^{14}-O-$, and $-C(=O)-O-R^{14}-O-C(=O)-$;

$R^{14}$ represents a linear, branched or cyclic alkylene group having 1-10 carbon atoms;

$R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom;

$R^7$ represents any one of a hydrogen atom, a fluorine atom, a methyl group, a trifluoromethyl group, and a difluoromethyl group;

$R^6$ and $R^7$ may be linked to form a ring, and the ring may contain an ether bond;

$R^{8a}$, $R^{8b}$, and $R^{8c}$ independently represent any one of a hydrogen atom, a fluorine atom, a methyl group, and a trifluoromethyl group; and a is 1 or 2.

In addition, in the resist top coat composition according to the present invention, the unit (P) of the polymer represented by the general formula (1) preferably comprises a repeating unit represented by the following general formula (4),

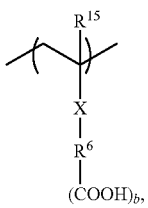

(4)

wherein $R^{15}$ represents any one of a hydrogen atom, a fluorine atom, a methyl group, a trifluoromethyl group, a carboxyl group, and a carboxyl methyl group;

X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms;

$R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom; and b is 1 or 2.

In addition, in the resist top coat composition according to the present invention, the unit (P) of the polymer represented by the general formula (1) preferably comprises a repeating unit represented by the following general formula (5),

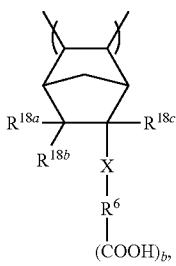

(5)

wherein X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms;

$R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom;

$R^{18a}$, $R^{18b}$, and $R^{18c}$ independently represent any one of a hydrogen atom, a fluorine atom, a methyl group, a trifluoromethyl group, a carboxyl group, and a carboxyl methyl group; and b is 1 or 2.

As mentioned above, when a resist top coat composition comprises a polymer including any one or more repeating units represented by the general formula (2) to (5), a top coat formed by using the composition has a high alkali solubility and thus can be stripped with an alkaline developer more easily at the time of development. In addition, such a top coat is suitably used with photoresist films.

Furthermore, in the resist top coat composition according to the present invention, the unit (P) of the polymer represented by the general formula (1) preferably comprises a repeating unit represented by the following general formula (6),

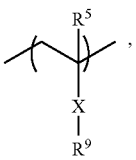

(6)

wherein $R^5$ represents any one of a hydrogen atom, a fluorine atom, a methyl group, and a trifluoromethyl group;

X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms; and $R^9$ represents a linear, branched or cyclic alkyl group having 1-20 carbon atoms, and hydrogen atoms of the alkyl group may be totally or partially substituted with a fluorine atom.

In addition, in the resist top coat composition according to the present invention, the unit (P) of the polymer represented by the general formula (1) preferably comprises a repeating unit represented by the following general formula (7),

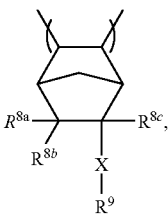

(7)

wherein X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms;

$R^{8a}$, $R^{8b}$, and $R^{8c}$ independently represent any one of a hydrogen atom, a fluorine atom, a methyl group, and a trifluoromethyl group; and $R^9$ represents a linear, branched or cyclic alkyl group having 1-20 carbon atoms, and hydrogen atoms of the alkyl group may be totally or partially substituted with a fluorine atom.

As mentioned above, when the resist top coat composition comprises a polymer including any one or more repeating units represented by the general formulae (6) and (7), forming a top coat by using the composition enhances water repellent property and water-sliding property of the top coat and effectively prevents the top coat from mixing with a photoresist film.

In addition, it is preferable that the resist top coat composition according to the present invention further comprises a solvent.

As mentioned above, the resist top coat composition further comprising a solvent has an even better property of forming the top coat.

Furthermore, the present invention provides a patterning process comprising: at least, a step of forming a photoresist film on a substrate; a step of forming a resist top coat on the photoresist film by using the resist top coat composition according to the present invention; a step of exposing the substrate; and a step of developing the substrate with a developer.

In this patterning process, it is natural that other various processes, such as an etching process, a resist removing process or a cleaning process may be conducted.

In addition, in the patterning process according to the present invention, the step of exposing the substrate is preferably conducted by liquid immersion lithography in which a gap between a projection lens and the substrate is filled with liquid.

In this way, conducting the step of exposing the substrate by liquid immersion lithography makes it possible to form a finer resist pattern on the photoresist film.

In addition, in the patterning process according to the present invention, the step of exposing the substrate may be conducted by using a light source having an exposure wavelength in the range of 180 to 250 nm; and using water as the liquid with which the gap between a projection lens and the substrate is filled.

In this way, an example of the liquid used in the liquid immersion lithography is water. And water is inserted in the gap between a projection lens and a substrate, and exposure is conducted by using a light source having an exposure wavelength in the range of 180 to 250 nm, whereby a still finer resist pattern can be formed.

Furthermore, in the patterning process according to the present invention, the step of developing the substrate is preferably conducted by developing the substrate with an alkaline developer to form a resist pattern on the photoresist film and simultaneously to strip the resist top coat on the photoresist film.

In this way, conducting the step of developing the substrate by developing the substrate with an alkaline developer to form a resist pattern on the photoresist film and simultaneously to strip the resist top coat on the photoresist film makes it possible to strip the resist top coat more easily without additional installation of system for stripping the resist top coat to conventional equipment.

As described above, the resist top coat composition according to the present invention comprises a polymer that has an amino group or a sulfonamide group at a polymer end and that is represented by the general formula (1). Therefore, forming a top coat on a photoresist film by using the composition makes it possible to effectively prevent an amine compound from migrating from the photoresist film. For example, it becomes possible to more certainly prevent film loss in the surface portions of the developed photoresist film. Consequently, rectangular and excellent resist patterns can be obtained more certainly.

DESCRIPTION OF THE INVENTION AND A PREFERRED EMBODIMENT

A more thorough disclosure of the present invention is presented in the detailed description which follows.

When a developer-soluble resist top coat is formed on a positive photoresist film, there occurs a problem such that film loss occurs in the surface portions of the developed photoresist film and the photoresist film on which a resist pattern is formed has a rounded top shape. The cause of the problem is considered that amine compounds added to the photoresist film migrates to the overlying resist top coat. The amine compounds are added to the photoresist film as quenchers for controlling acid diffusion, enhancing contrast, and controlling sensitivity. And for example, when fluoro alcohol units exist in the resist top coat, fluoro alcohol generally has a high affinity for amine compounds, and thus amine compounds added to the photoresist film tend to migrate to the top coat. As a result, it is considered that the concentration of the amine compounds that are added to the photoresist film for the purpose of preventing acid diffusion and the like decreases at the surface of the photoresist film, and thus rounded top shapes are observed.

In order to suppress the migration of amine compounds in a photoresist film to a resist top coat, the present inventors attempted to add an amine compound to a resist top coat composition. In this case, however, it has turned out that a developed resist pattern can have a T-top profile. This is considered to be caused because the amine compound added to a resist top coat migrated to the photoresist film and formed a hardly-soluble surface layer. Then in order to avoid forming the hardly-soluble surface layer, addition of amides having weak basicity, aniline, pyridine, or the like was attempted. However, it has turned out that these compounds have a strong absorption at the wavelength of 193 nm, thereby deteriorating the sensitivity of resists.

Furthermore, use of polymers in which basic units are introduced to the main chains or side chains of the polymers is considered to be effective for preventing the migration of amine compounds in a resist layer. In fact, the present inventors have found that use of a top coat composition including a polymer in which a substituent such as an amino group or a sulfonamide group is introduced to side chains of the polymer alleviates the rounded top shape. However, such a polymer has a low content of repeating units including an amino group or a sulfonamide group, and thus the basic unit probably does not uniformly exist in the polymer.

Then in order to solve the problem of nonuniformity of the basic unit, the present inventors have devised a method of introducing the basic unit to a polymer end by conducting polymerization with a chain transfer agent containing the basic unit. Then the inventors have found that use of thus obtained polymer as a composition for forming a resist top coat overlying a photoresist film reduces the rounded top shape occurred in liquid immersion lithography and the like. As a result, they have accomplished the present invention.

That is, the present invention provides a resist top coat composition, comprising at least a polymer that has an amino group or a sulfonamide group at a polymer end and that is represented by the following general formula (1),

(1)

wherein the (P) represents a unit obtained by polymerization of a polymerizable compound;

$R^1$ represents a single bond or a linear, branched or cyclic alkylene group having 1-10 carbon atoms;

$R^2$ and $R^3$ independently represent any one of a hydrogen atom, a linear, branched or cyclic alkyl group having 1-20 carbon atoms, and $-SO_2R^4$;

either $R^1$ and $R^2$, $R^1$ and $R^3$, or $R^2$ and $R^3$ may be linked to form a ring; and $R^4$ represents any one of a linear, branched or cyclic alkyl group having 1-10 carbon atoms and an aryl group having 6-20 carbon atoms; the alkyl group and the aryl group may contain one or more groups selected from an ether group and an ester group; and hydrogen atoms of the alkyl group and the aryl group may be totally or partially substituted with a fluorine atom.

Incidentally, when either $R^1$ and $R^2$, $R^1$ and $R^3$, or $R^2$ and $R^3$ are linked to form a ring, $R^1$ represents a linear, branched or cyclic alkanetriyl group having 1-10 carbon atoms, $R^2$ and $R^3$ independently represent a linear, branched or cyclic alkylene group having 1-20 carbon atoms.

As mentioned above, the resist top coat composition according to the present invention comprises a polymer that has an amino group or a sulfonamide group at a polymer end and that is represented by the general formula (1). Therefore, forming a top coat on a photoresist film by using the composition makes it possible to effectively prevent an amine compound from migrating from the photoresist film. For example, it becomes possible to more certainly prevent film loss in the surface portions of developed photoresist film. Consequently, rectangular and excellent resist patterns can be obtained more certainly.

As for $R^2$ and $R^3$ in the general formula (1), examples of the linear, branched or cyclic alkyl group having 1-20 carbon atoms may include: methyl group, ethyl group, n-propyl group, isopropyl group, n-butyl group, sec-butyl group, tert-butyl group, tert-amyl group, n-pentyl group, n-hexyl group, n-octyl group, n-nonyl group, n-decyl group, cyclopropyl group, cyclobutyl group, cyclopentyl group, cyclohexyl group, cyclopentylmethyl group, cyclopentylethyl group, cyclopentylbutyl group, cyclohexylmethyl group, cyclohexylethyl group, cyclohexylbutyl group, and so on.

As for $R^4$ in the general formula (1), examples of the linear, branched or cyclic alkyl group having 1-10 carbon atoms may include the above-mentioned alkyl groups that have 1-10 carbon atoms.

As for $R^1$ in the general formula (1), examples of the linear, branched or cyclic alkylene group having 1-10 carbon atoms may include the above-mentioned alkyl groups that have 1-10 carbon atoms in which a hydrogen atom is eliminated therefrom.

In addition, in the resist top coat composition according to the present invention, the unit (P) of the polymer represented by the general formula (1) preferably comprises a repeating unit represented by the following general formula (2),

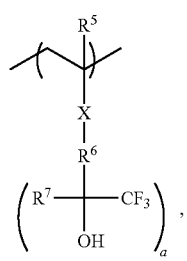

(2)

wherein $R^5$ represents any one of a hydrogen atom, a fluorine atom, a methyl group, and a trifluoromethyl group;

X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms;

$R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom;

$R^7$ represents any one of a hydrogen atom, a fluorine atom, a methyl group, a trifluoromethyl group, and a difluoromethyl group;

$R^6$ and $R^7$ may be linked to form a ring, and the ring may contain an ether bond; and a is 1 or 2.

In addition, in the resist top coat composition according to the present invention, the unit (P) of the polymer represented by the general formula (1) preferably comprises a repeating unit represented by the following general formula (3),

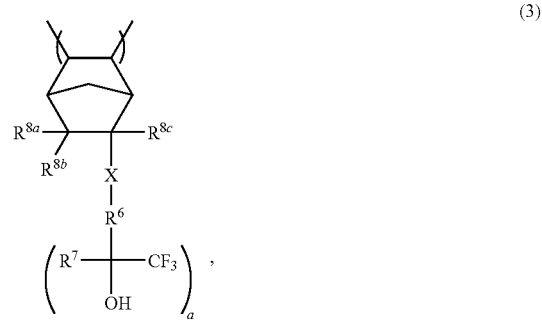

(3)

wherein X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms;

$R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom;

$R^7$ represents any one of a hydrogen atom, a fluorine atom, a methyl group, a trifluoromethyl group, and a difluoromethyl group;

$R^6$ and $R^7$ may be linked to form a ring, and the ring may contain an ether bond;

$R^{8a}$, $R^{8b}$, and $R^{8c}$ independently represent any one of a hydrogen atom, a fluorine atom, a methyl group, and a trifluoromethyl group; and a is 1 or 2.

In addition, in the resist top coat composition according to the present invention, the unit (P) of the polymer represented by the general formula (1) preferably comprises a repeating unit represented by the following general formula (4),

(4)

wherein $R^5$ represents any one of a hydrogen atom, a fluorine atom, a methyl group, a trifluoromethyl group, a carboxyl group, and a carboxyl methyl group;

X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms;

$R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom; and b is 1 or 2.

In addition, in the resist top coat composition according to the present invention, the unit (P) of the polymer represented by the general formula (1) preferably comprises a repeating unit represented by the following general formula (5),

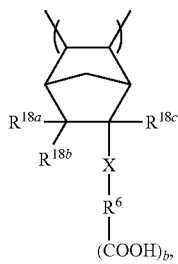

(5)

wherein X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms;

$R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom;

$R^{18a}$, $R^{18b}$, and $R^{18c}$ independently represent any one of a hydrogen atom, a fluorine atom, a methyl group, a trifluoromethyl group, a carboxyl group, and a carboxyl methyl group; and b is 1 or 2.

As mentioned above, when a resist top coat composition comprises a polymer including any one or more repeating units represented by the general formulae (2) to (5), a top coat formed with the composition has a high alkali solubility and thus can be stripped with an alkaline developer more easily at the time of development. In addition, such a top coat is suitably used with photoresist films.

The unit (P) of the polymer represented by the general formula (1) may be comprised of only one repeating unit among the repeating units represented by the general formulae (2) to (5), or a combination of two or more repeating units among the repeating units represented by the general formulae (2) to (5).

Furthermore, in the resist top coat composition according to the present invention, the unit (P) of the polymer represented by the general formula (1) preferably comprises a repeating unit represented by the following general formula (6),

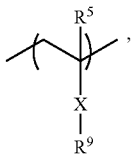

(6)

wherein $R^5$ represents any one of a hydrogen atom, a fluorine atom, a methyl group, and a trifluoromethyl group;

X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms; and $R^9$ represents a linear, branched or cyclic alkyl group having 1-20 carbon atoms, and hydrogen atoms of the alkyl group may be totally or partially substituted with a fluorine atom.

In addition, in the resist top coat composition according to the present invention, the unit (P) of the polymer represented by the general formula (1) preferably comprises a repeating unit represented by the following general formula (7),

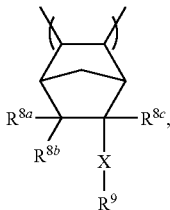

(7)

wherein X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—;

$R^{14}$ represents a linear, branched or cyclic alkylene group having 1-10 carbon atoms;

$R^{8a}$, $R^{8b}$, and $R^{8c}$ independently represent any one of a hydrogen atom, a fluorine atom, a methyl group, and a trifluoromethyl group; and $R^9$ represents a linear, branched or cyclic alkyl group having 1-20 carbon atoms, and hydrogen atoms of the alkyl group may be totally or partially substituted with a fluorine atom.

As mentioned above, when the resist top coat composition comprises a polymer including any one or more repeating units represented by the general formula (6) and (7), forming a top coat with the composition enhances water repellent property and water-sliding property of the top coat and effectively prevents the top coat from mixing with a photoresist film.

The unit (P) of the polymer represented by the general formula (1) may be comprised of only one repeating unit among the repeating units represented by the general formulae (6) and (7), or a combination of two or more repeating units among the repeating units represented by the general formulae (6) and (7).

The unit (P) in the general formula (1) that is obtained by polymerizing a polymerizable compound can offer sufficient performance with a basic unit at the polymer end. In order to impart further basicity to the unit (P), the unit (P) may contain one or more repeating units represented by the following general formulae (8) and (9) in addition to one or more repeating units represented by the general formulae (2) to (7). That is, the unit (P) may include only one unit among those represented by the general formulae (8) and (9), or a combination of two or more selected from units represented by the general formulae (8) and (9).

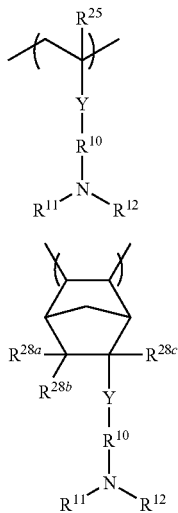

(8)

(9)

In the formulae, $R^{25}$ represents any one of a hydrogen atom, a fluorine atom, a methyl group, and a trifluoromethyl group;

Y represents any one of a single bond, —O—, —C(=O)—O—, —O—CH$_2$—C(=O)—O—, and —C(=O)—O—CH$_2$—C(=O)—O—;

$R^{28a}$, $R^{28b}$, and $R^{28c}$ independently represent any one of a hydrogen atom, a fluorine atom, a methyl group, and a trifluoromethyl group;

$R^{10}$ represents a single bond, or a linear, branched or cyclic alkylene group having 1-10 carbon atoms;

$R^{11}$ and $R^{12}$ independently represent any one of a hydrogen atom, a linear, branched or cyclic alkyl group having 1-20 carbon atoms, and —SO$_2$R$^{13}$;

either $R^{10}$ and $R^{11}$, $R^{10}$ and $R^{12}$, or $R^{11}$ and $R^{12}$ may be linked to form a ring; and $R^{13}$ represents any one of a linear, branched or cyclic alkyl group having 1-10 carbon atoms and an aryl group having 6-20 carbon atoms; the alkyl group and the aryl group may contain an ether group or an ester group; and hydrogen atoms of the alkyl group and the aryl group may be totally or partially substituted with a fluorine atom.

Incidentally, when ($R^{10}$ and $R^{11}$) or ($R^{10}$ and $R^{12}$) are linked to form a ring, $R^{10}$ represents a linear, branched or cyclic alkanetriyl group having 1-10 carbon atoms. When ($R^{10}$ and $R^{11}$) or ($R^{11}$ and $R^{12}$) are linked to form a ring, $R^{11}$ represents a linear, branched or cyclic alkylene group having 1-20 carbon atoms. When ($R^{10}$ and $R^{12}$) or ($R^{11}$ and $R^{12}$) are linked to form a ring, $R^{12}$ represents a linear, branched or cyclic alkylene group having 1-20 carbon atoms.

Examples of the repeating unit represented by the general formula (2) may include without limitation the following units. In the following formulae, $R^5$ represents any one of a hydrogen atom, a fluorine atom, a methyl group, and a trifluoromethyl group.

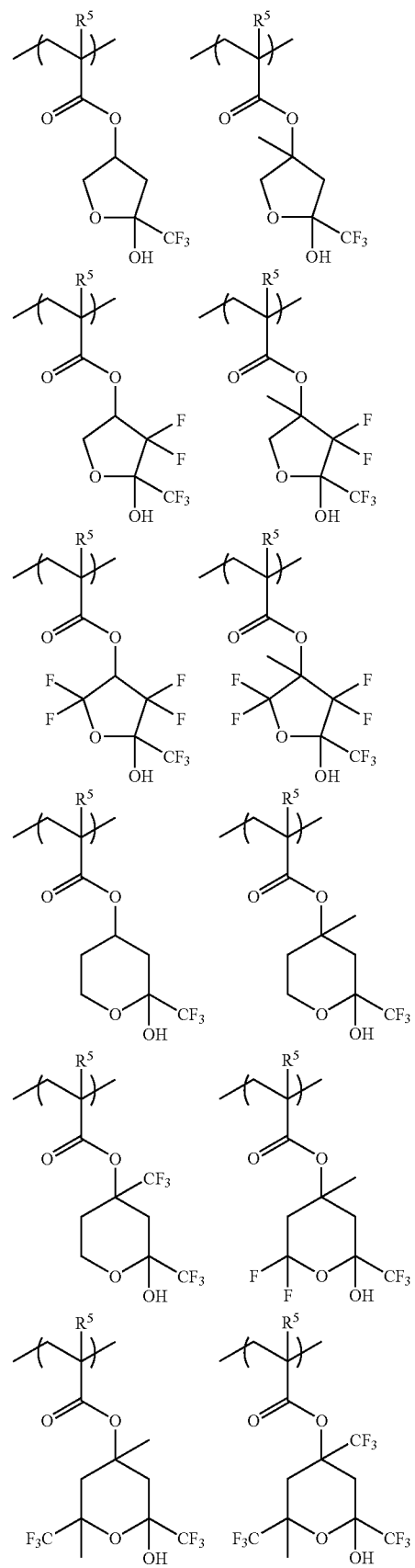

-continued
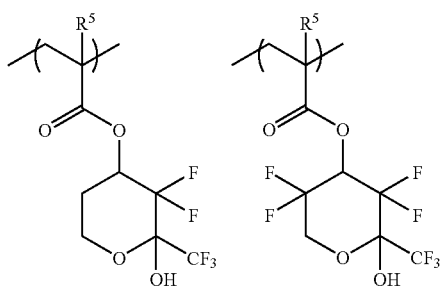
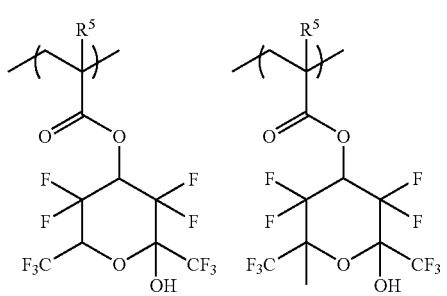
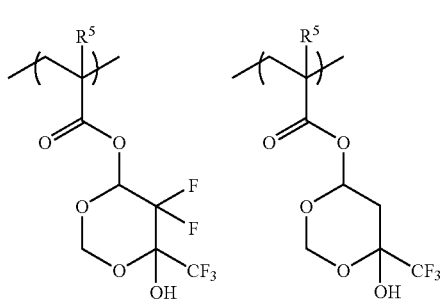
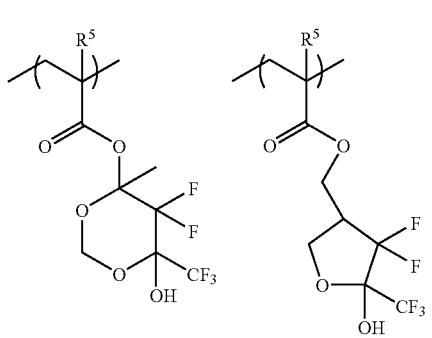
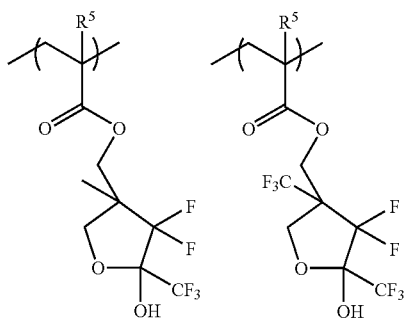
-continued
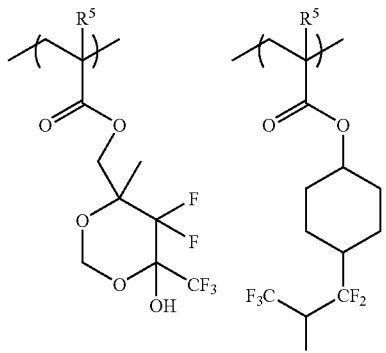
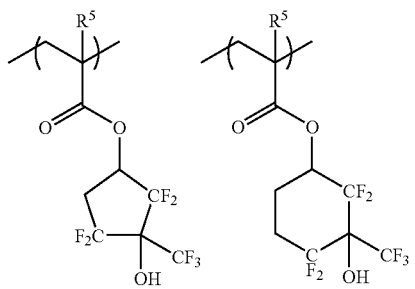
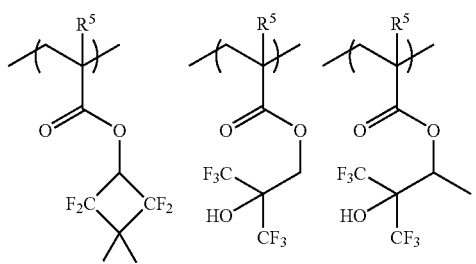
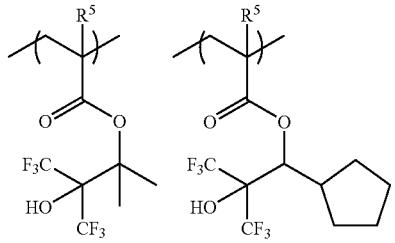
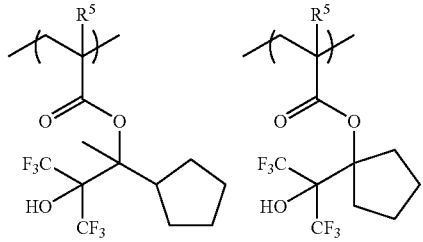
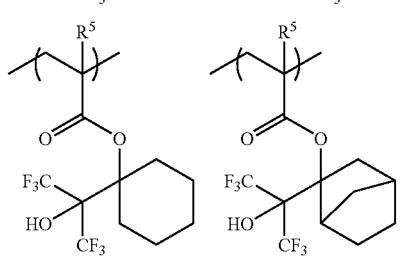

-continued
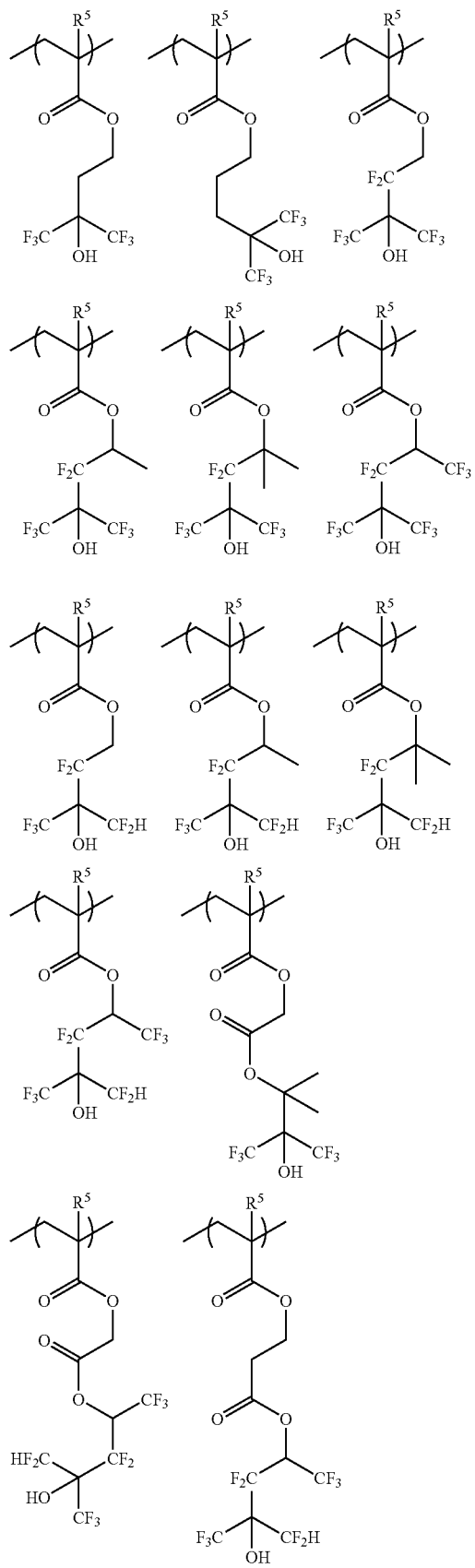
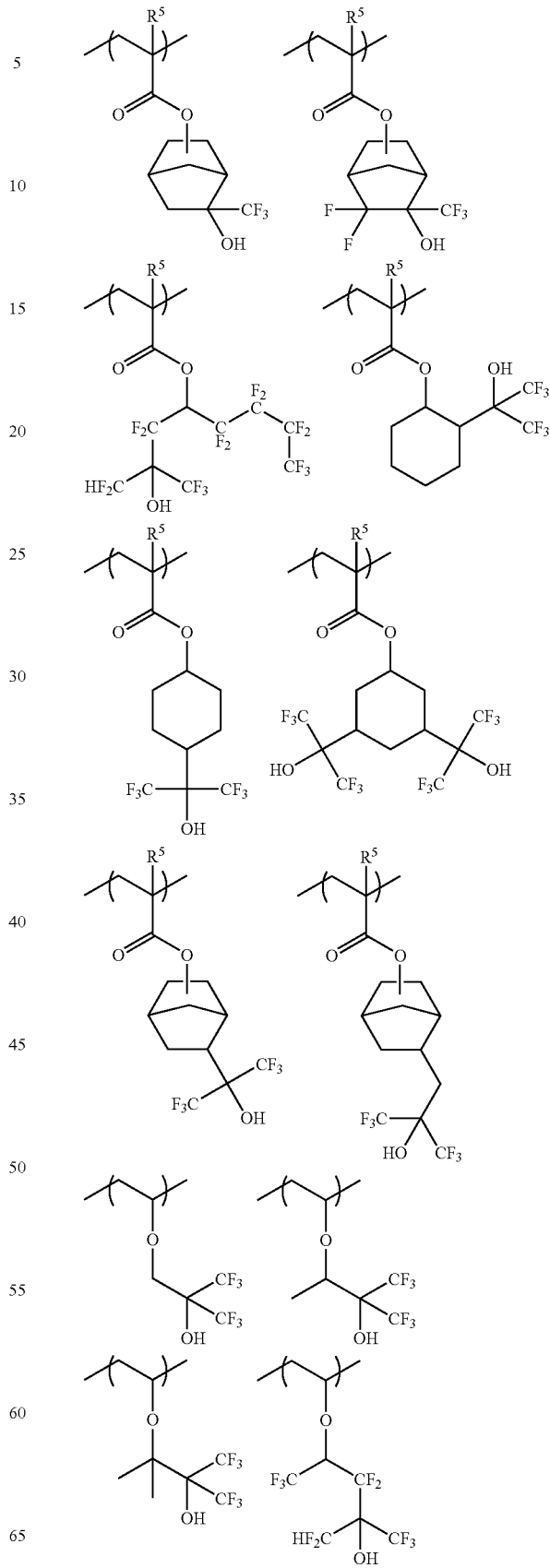

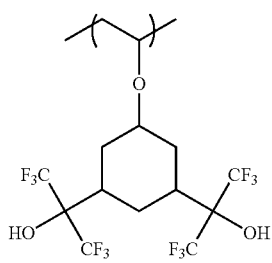
Examples of the repeating unit represented by the general formula (3) may include without limitation the following units. In the following formulae, $R^{8c}$ represents any one of a hydrogen atom, a fluorine atom, a methyl group, and a trifluoromethyl group.
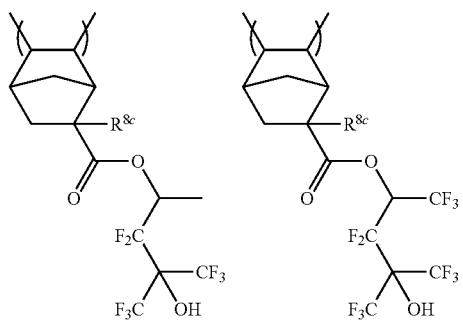
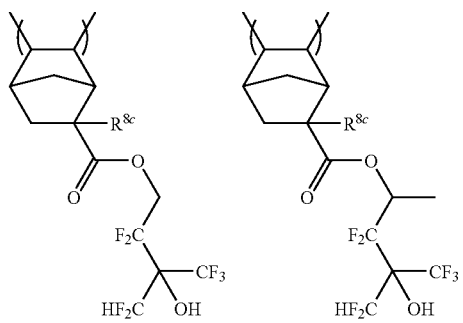
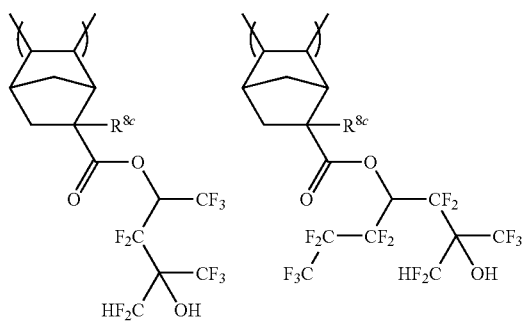
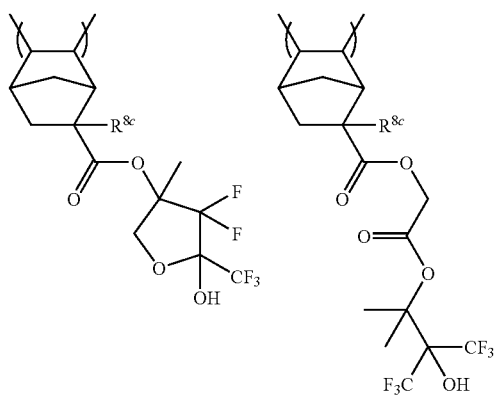

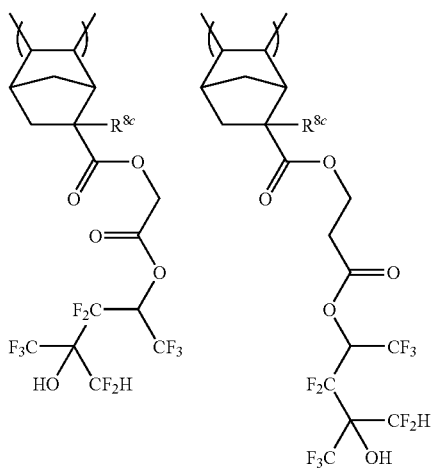
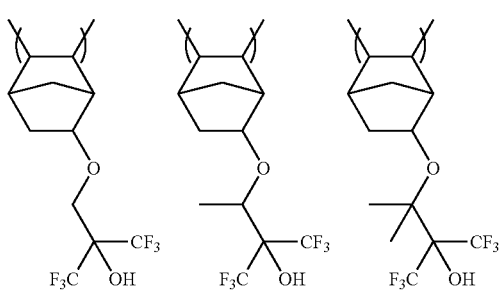
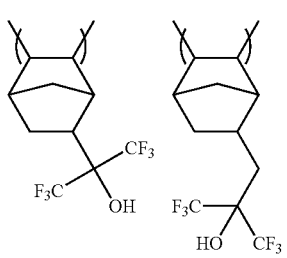
Examples of the repeating unit represented by the general formula (4) may include without limitation the following units. In the following formulae, $R^{15}$ represents any one of a hydrogen atom, a fluorine atom, a methyl group, a trifluoromethyl group, a carboxyl group, and a carboxyl methyl group.
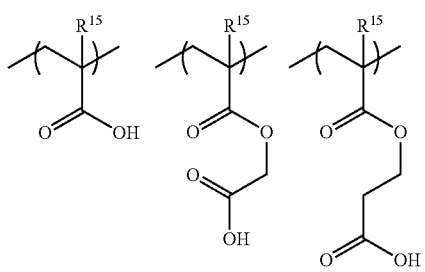
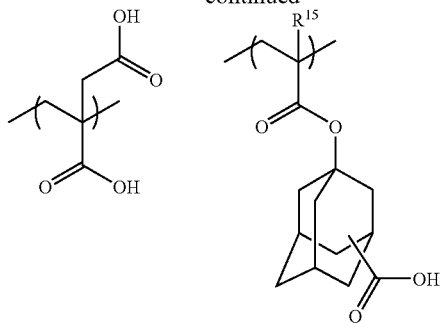
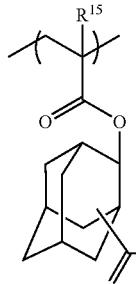
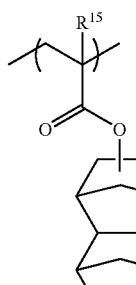
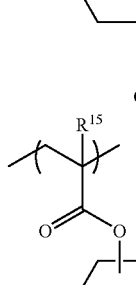
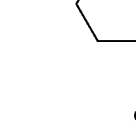
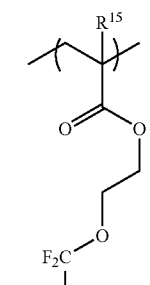
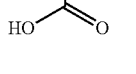

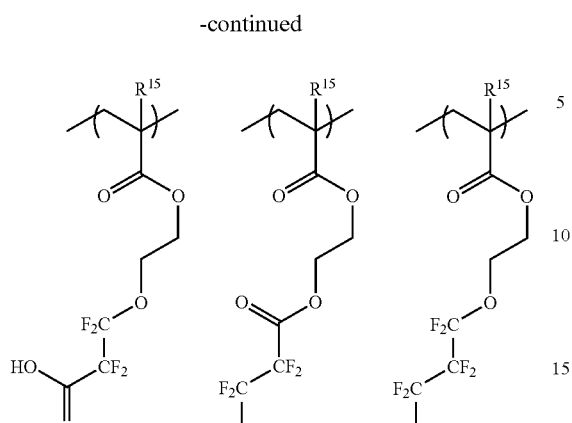
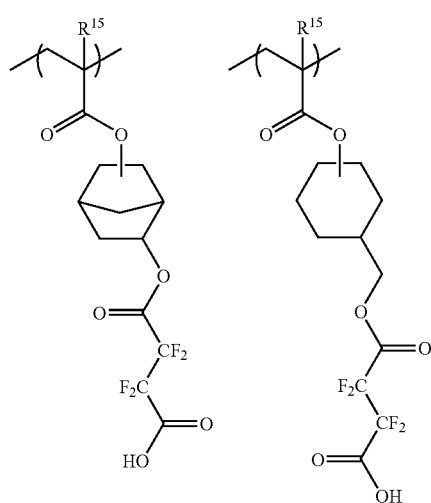
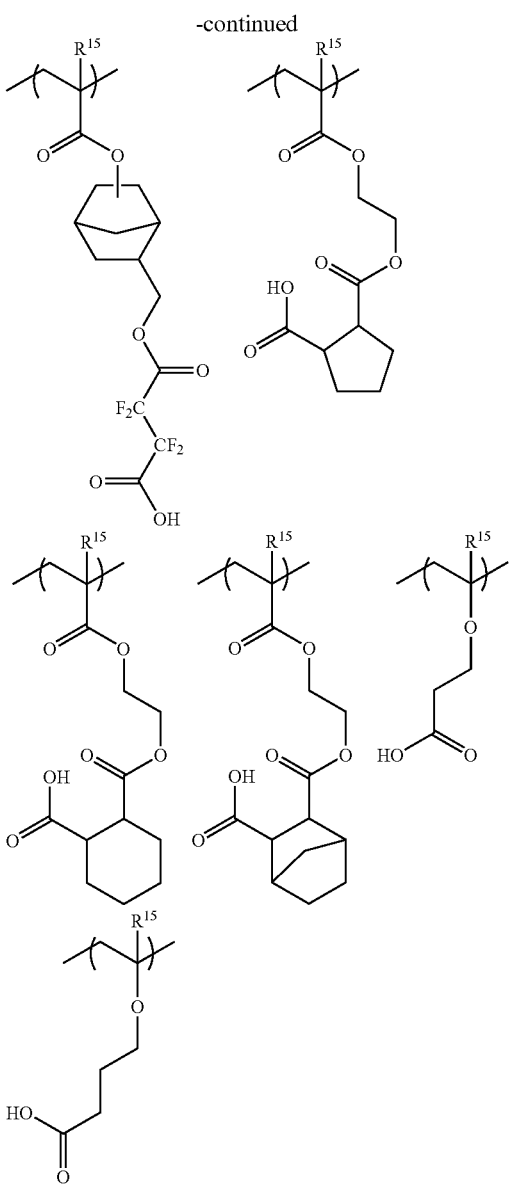

Examples of the repeating unit represented by the general formula (5) may include without limitation the following units. In the following formulae, $R^{18c}$ represents any one of a hydrogen atom, a fluorine atom, a methyl group, a trifluoromethyl group, a carboxyl group, and a carboxyl methyl group.

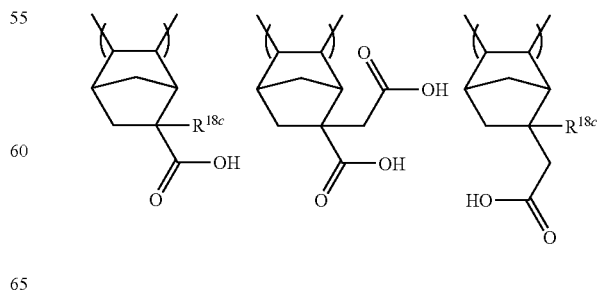

Examples of the repeating unit represented by the general formula (6) may include without limitation the following units. In the following formulae, $R^5$ represents any one of a hydrogen atom, a fluorine atom, a methyl group, and a trifluoromethyl group.
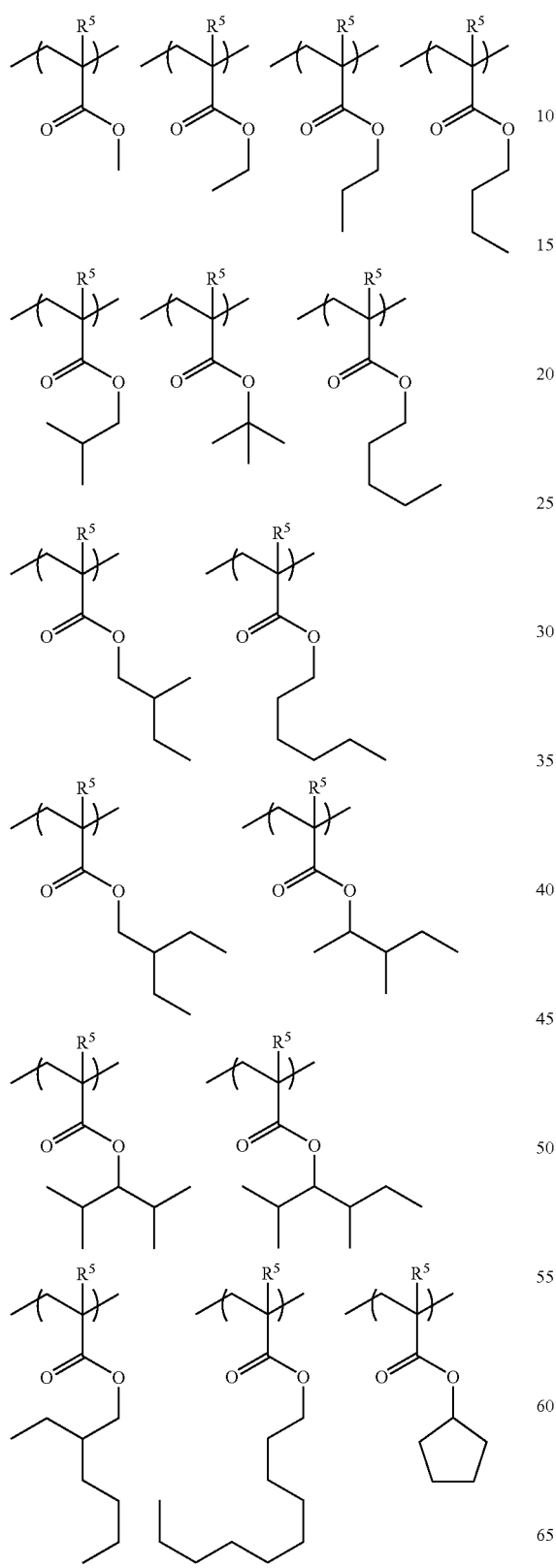
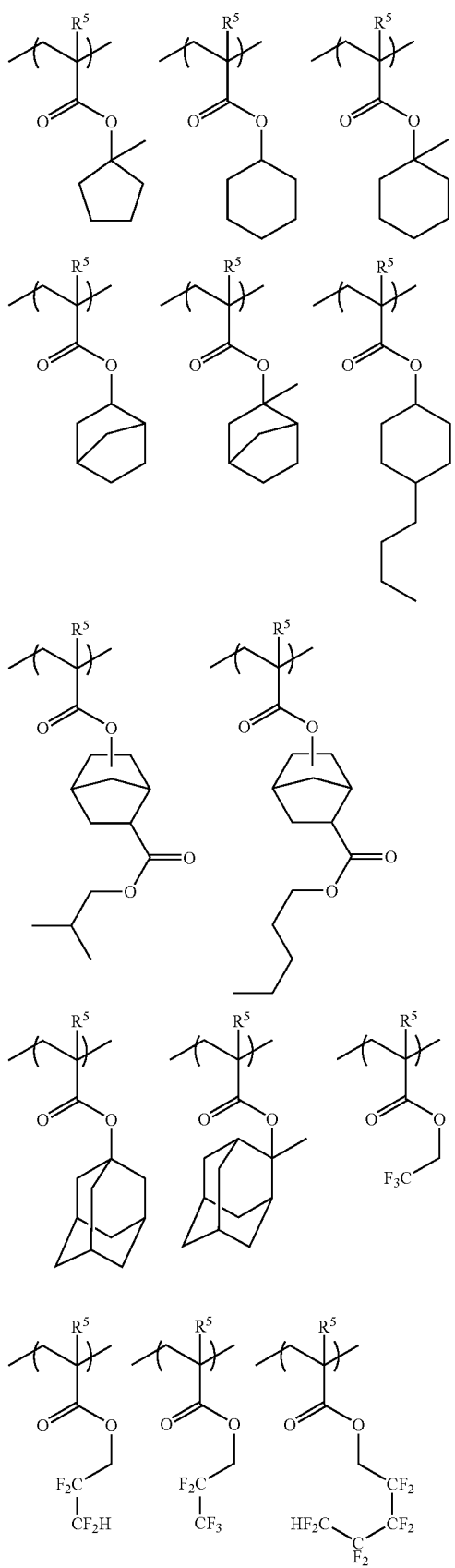

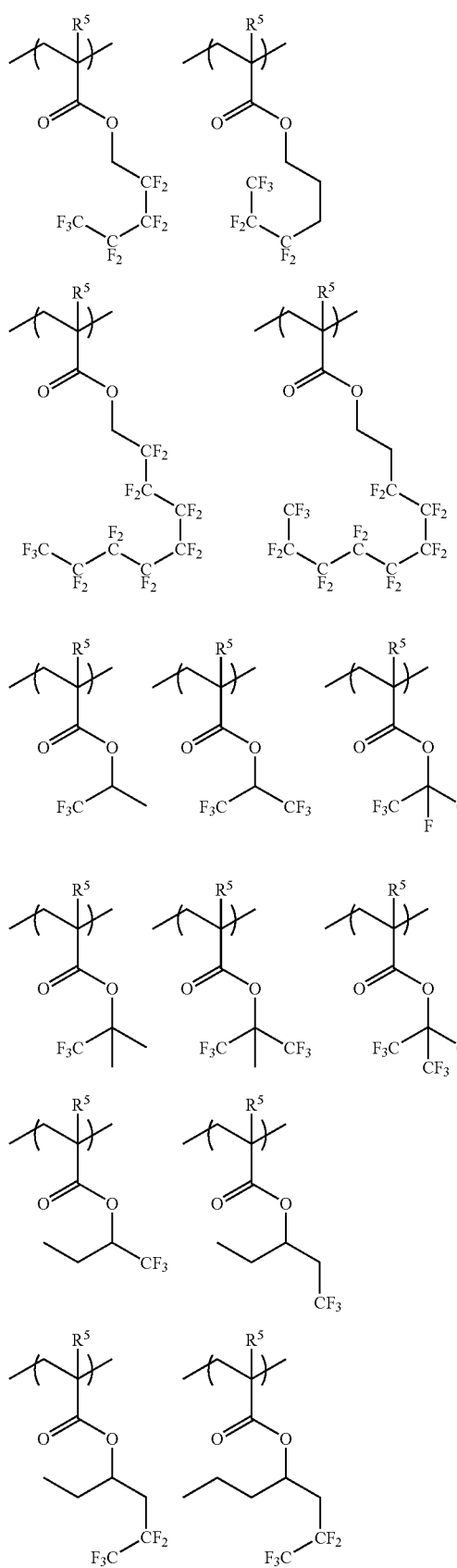
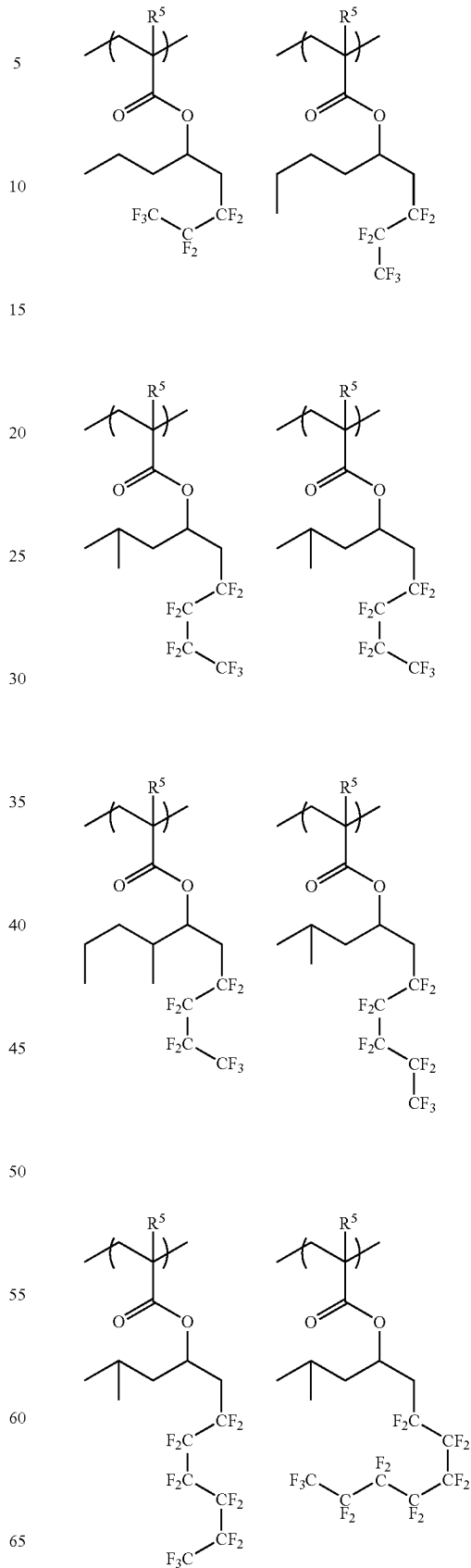

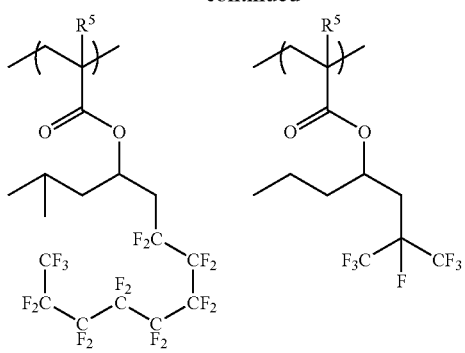
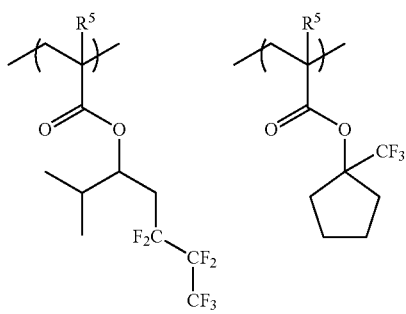
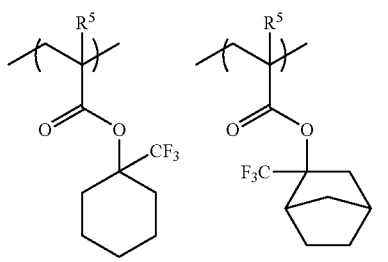
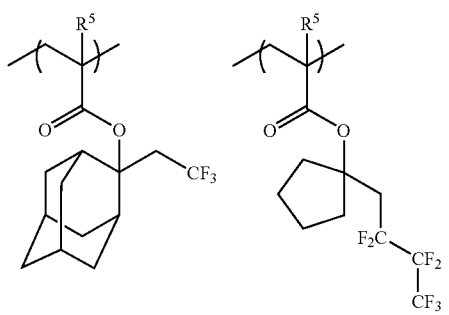
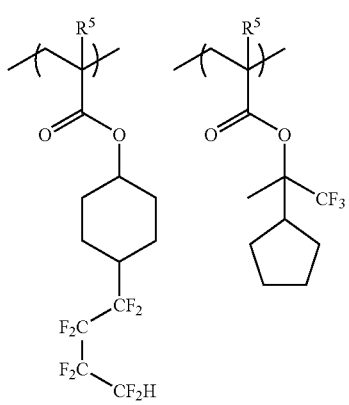
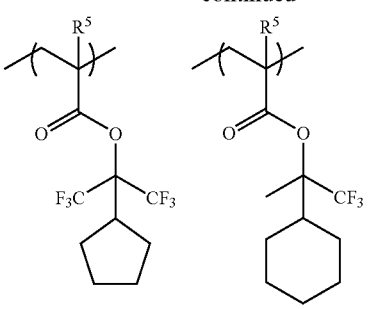
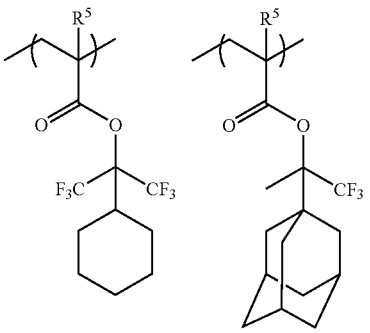
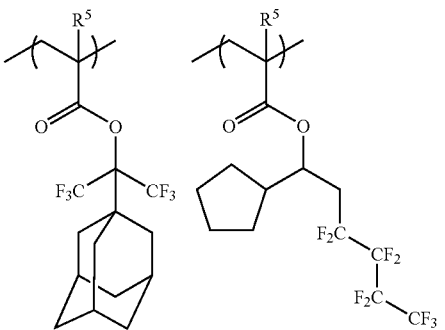
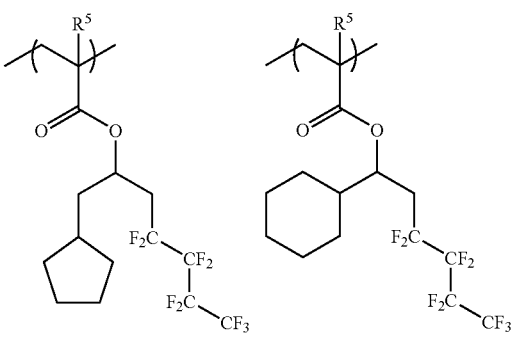

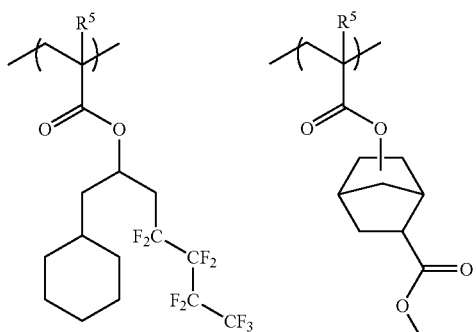
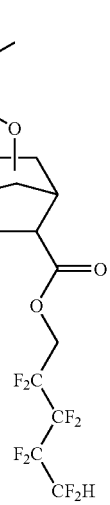
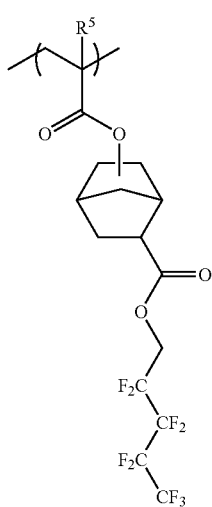
Examples of the repeating unit represented by the general formula (7) may include without limitation the following units. In the following formulae, $R^{8c}$ represents any one of a hydrogen atom, a fluorine atom, a methyl group, and a trifluoromethyl group.
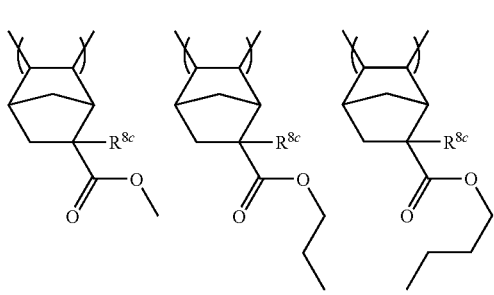
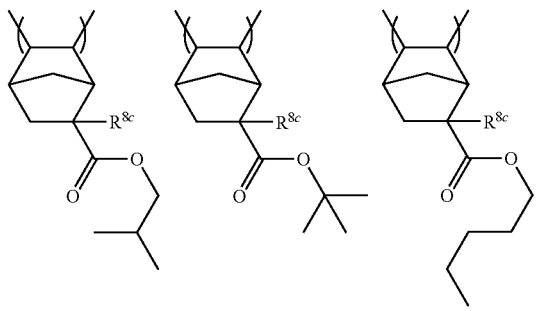
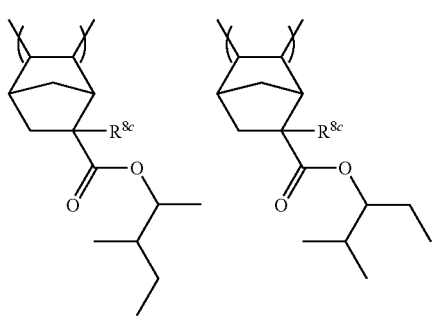
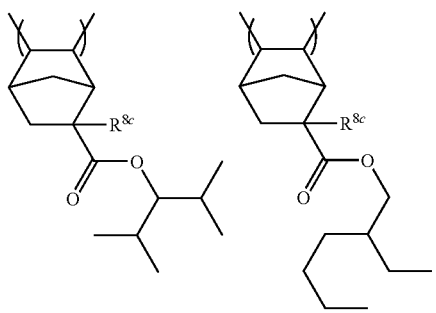
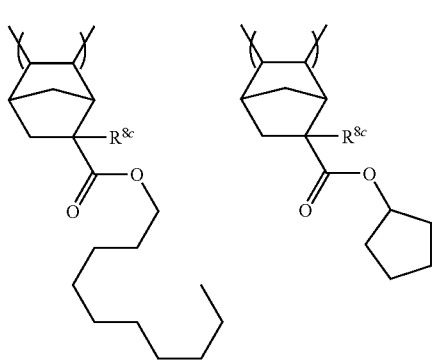
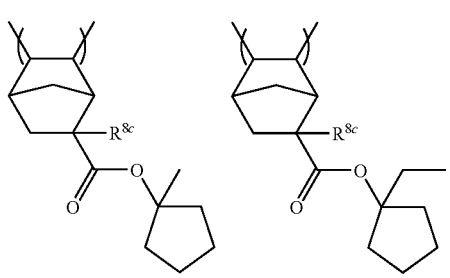

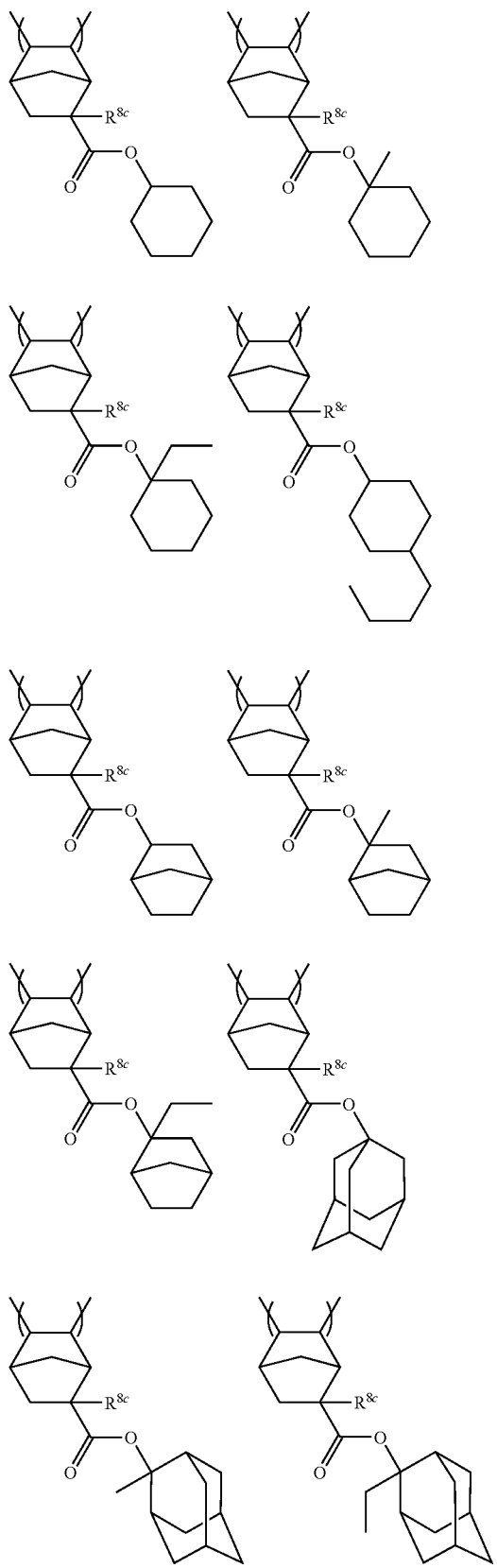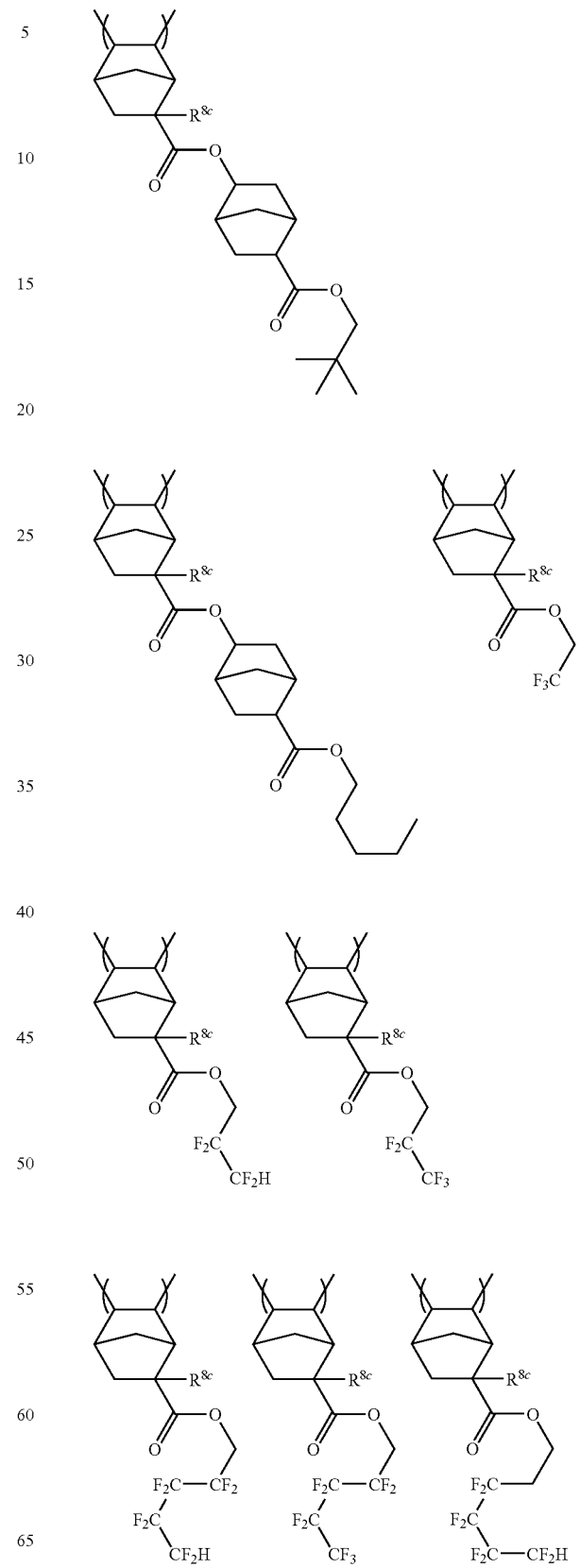

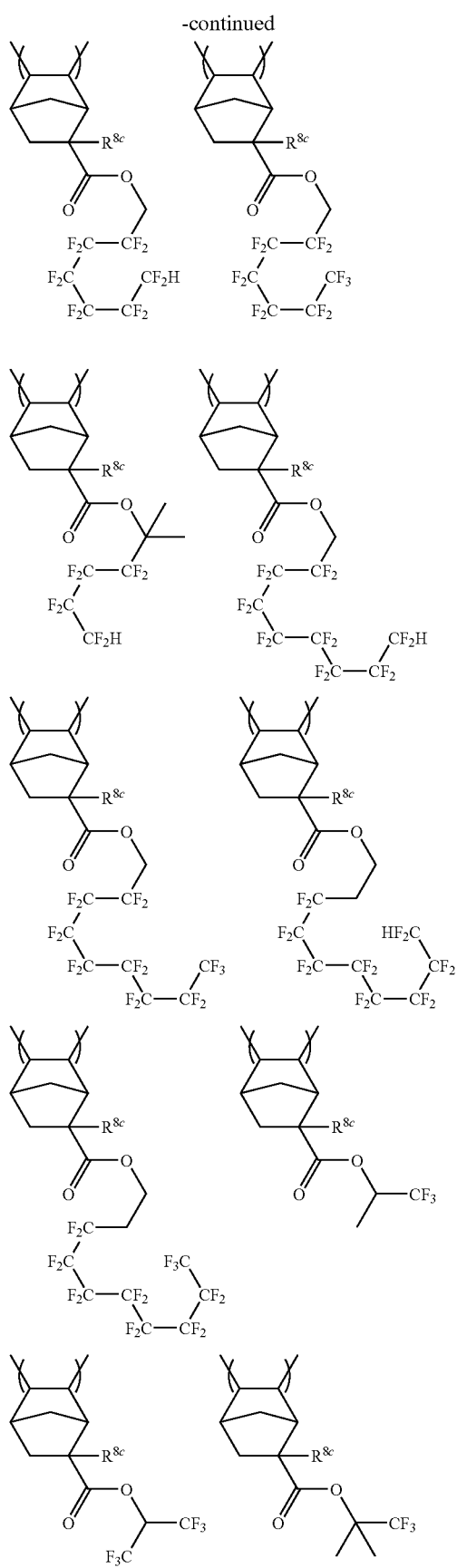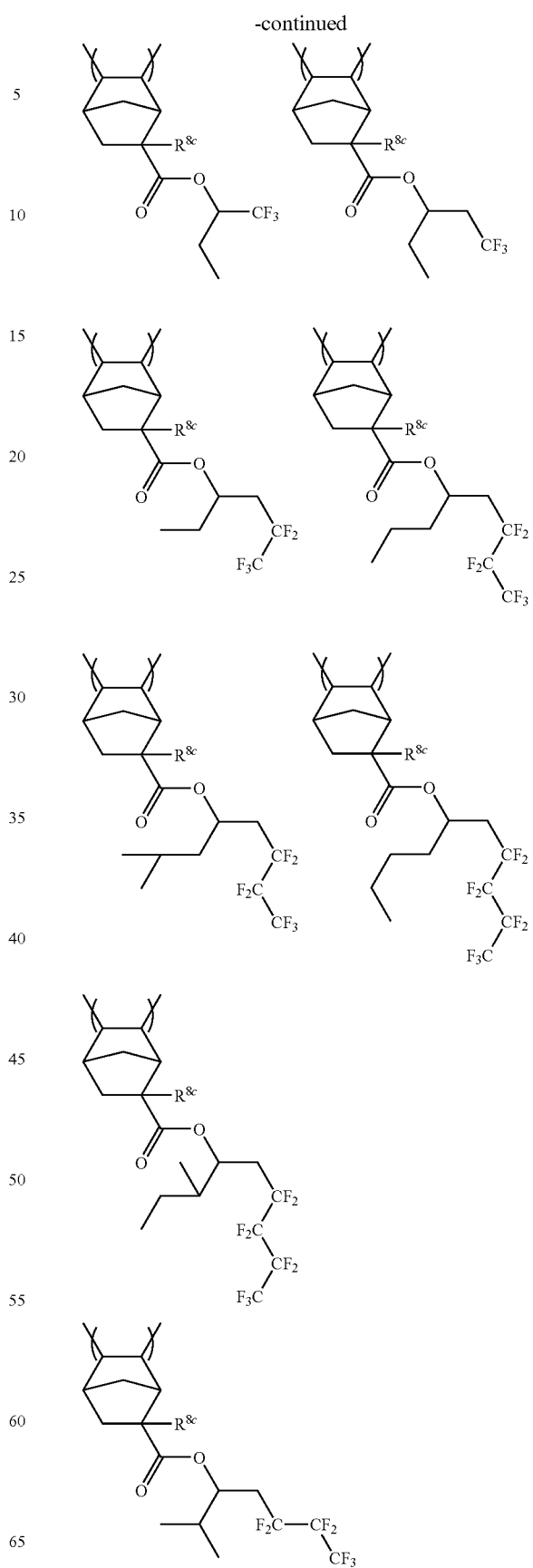

-continued
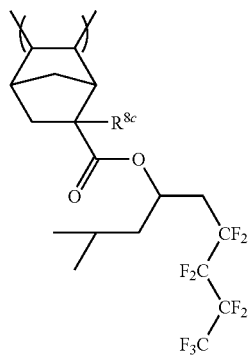
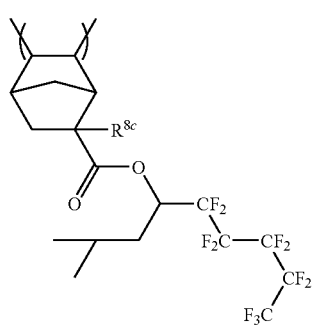
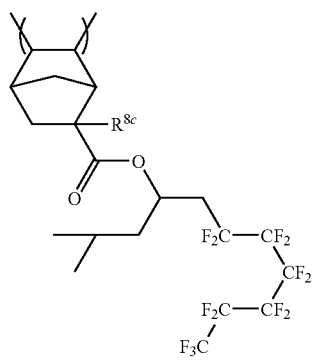
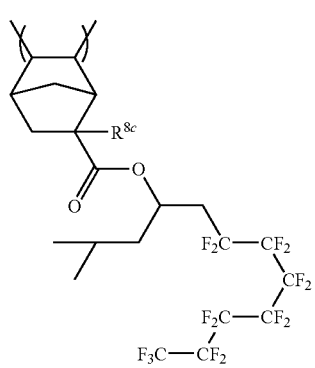
-continued
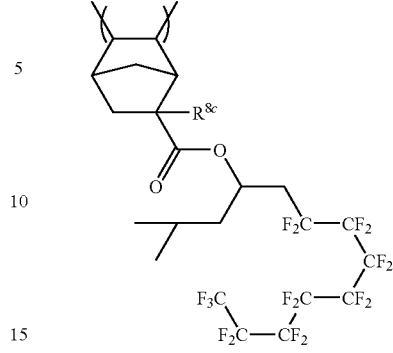
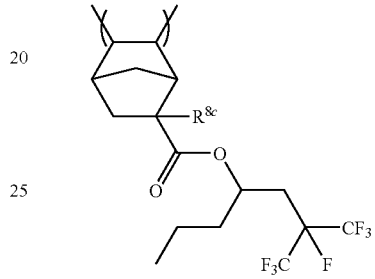
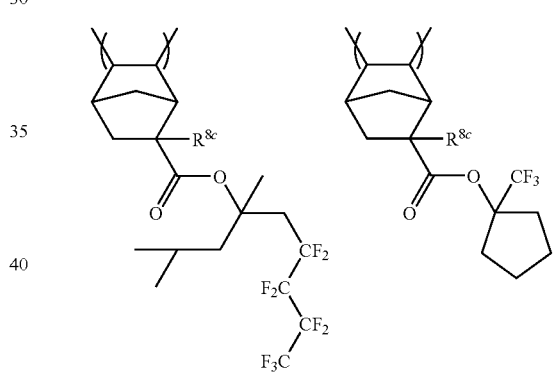
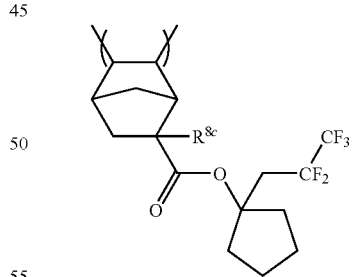
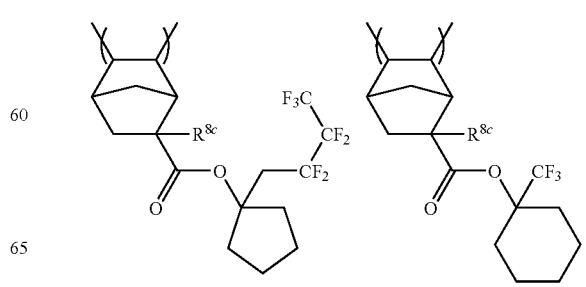

-continued
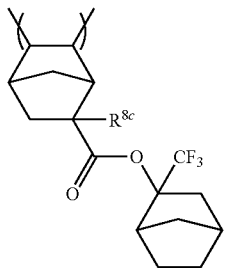
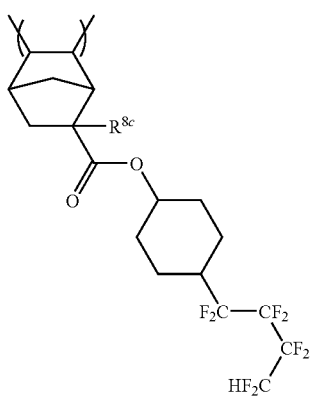
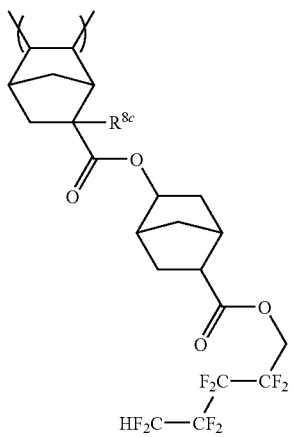
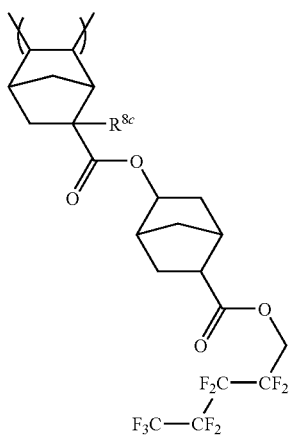
-continued
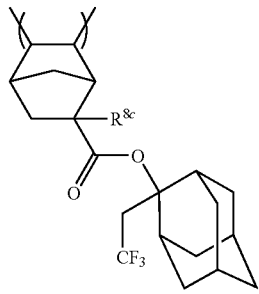
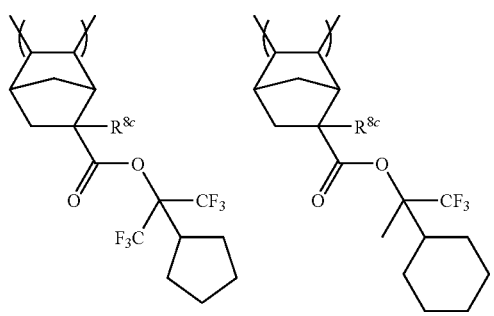
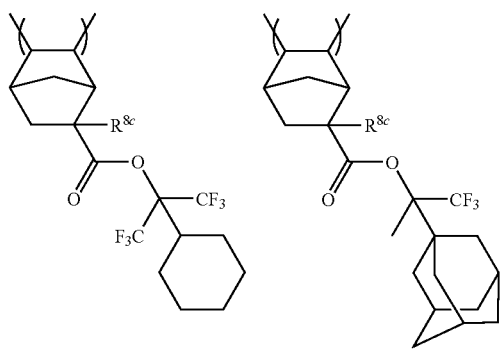
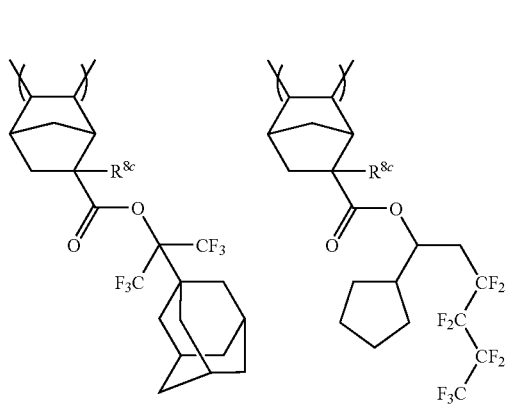

-continued
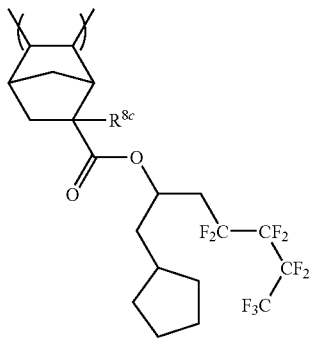
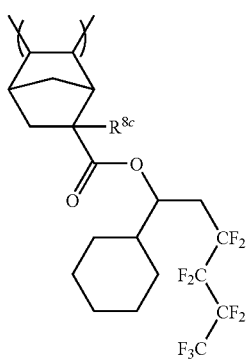
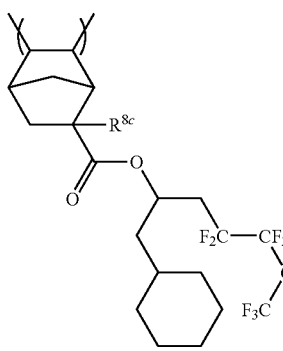
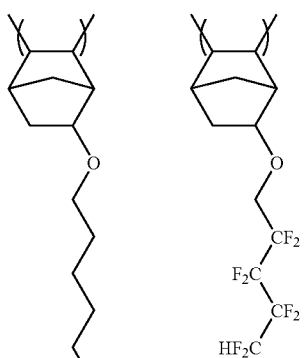
-continued
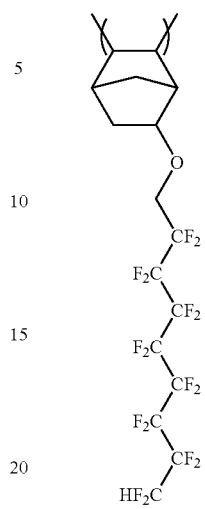
Examples of the repeating unit represented by the general formula (8) may include without limitation the following units. In the following formulae, $R^{25}$ represents any one of a hydrogen atom, a fluorine atom, a methyl group, and a trifluoromethyl group.
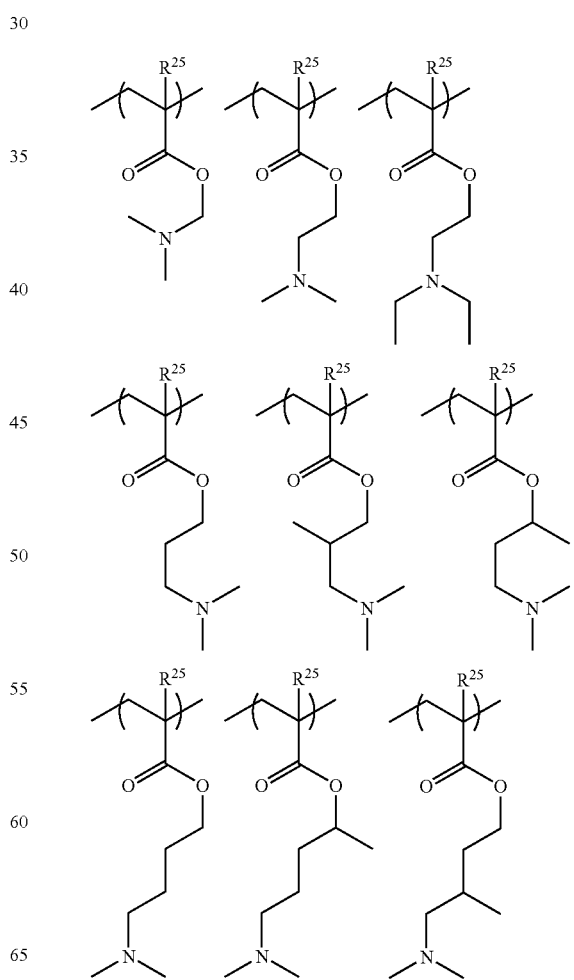

-continued
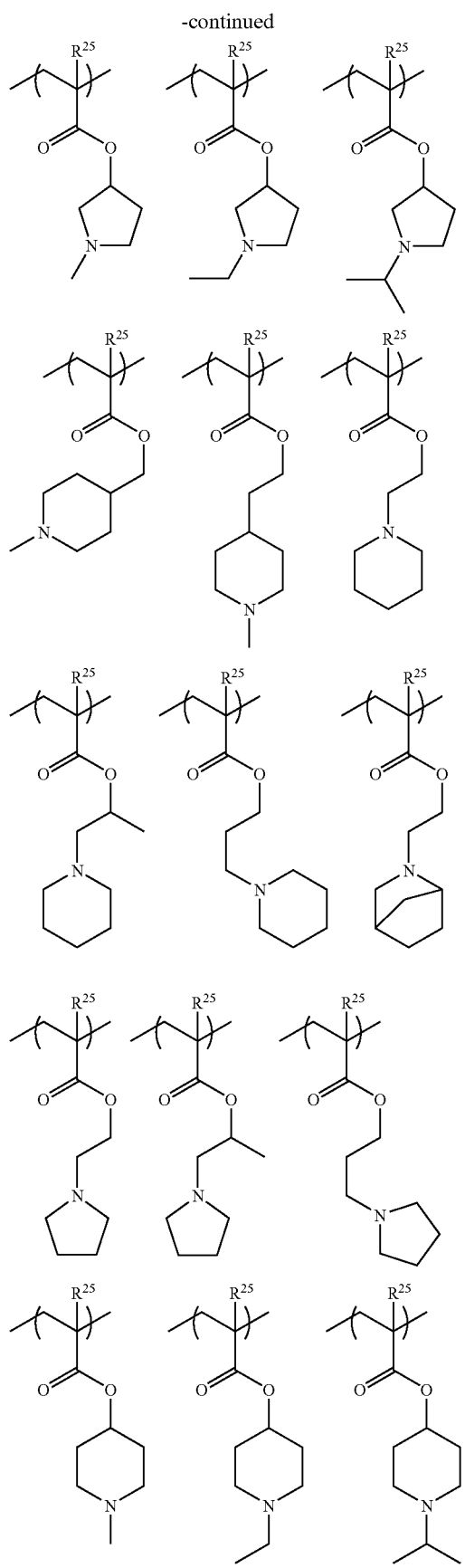
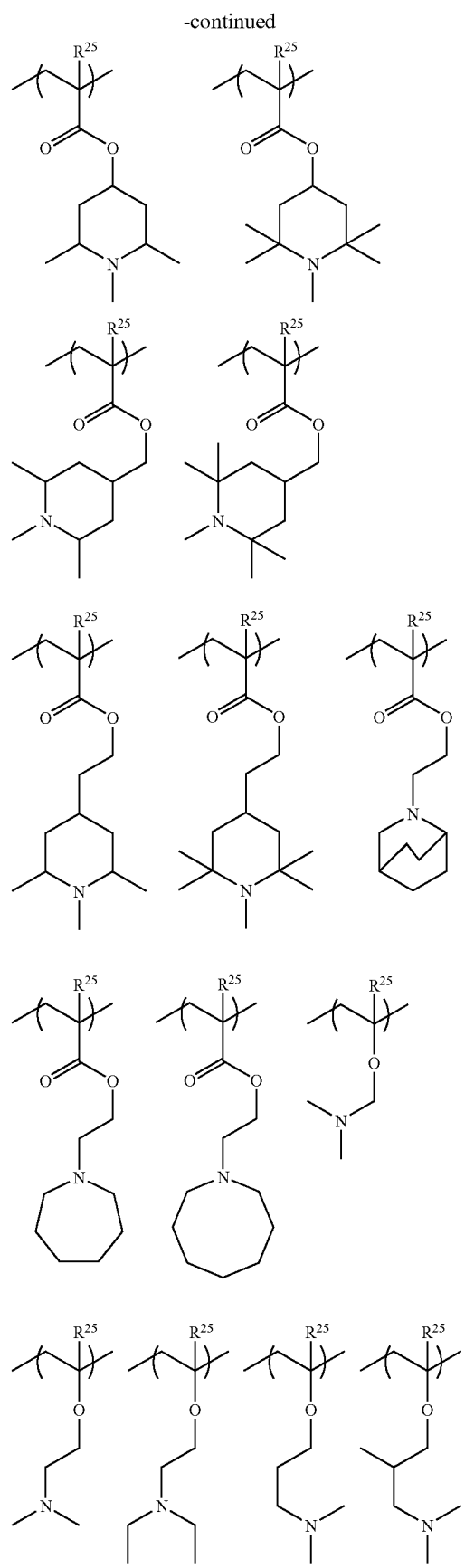

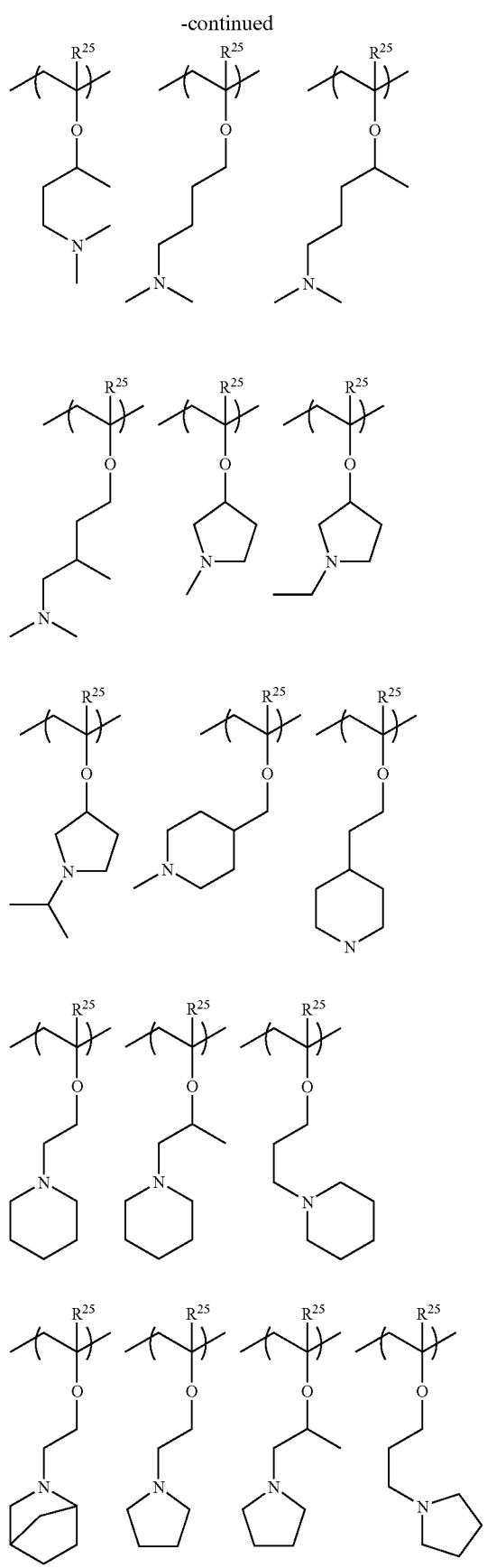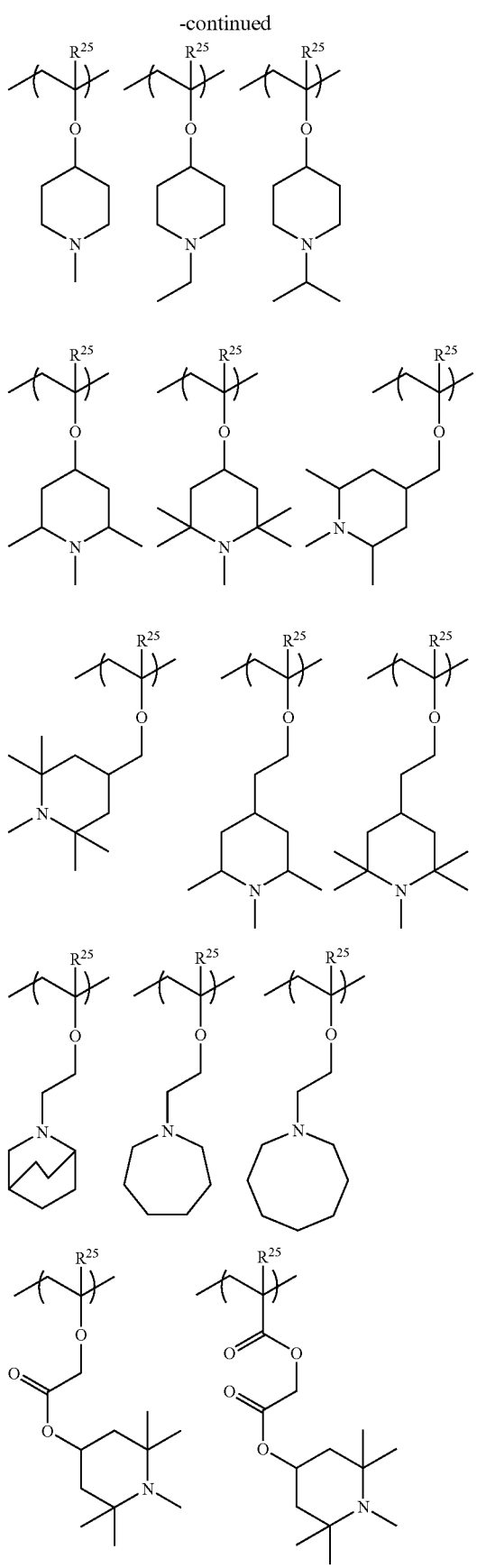

-continued
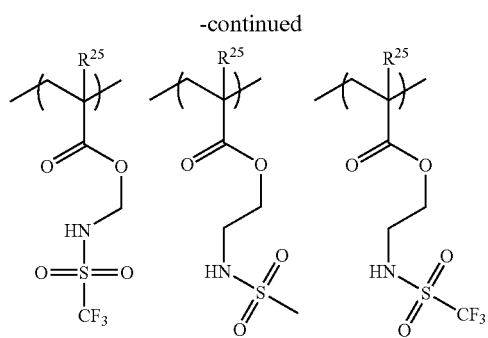
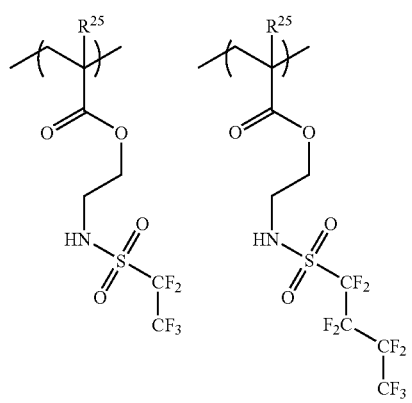
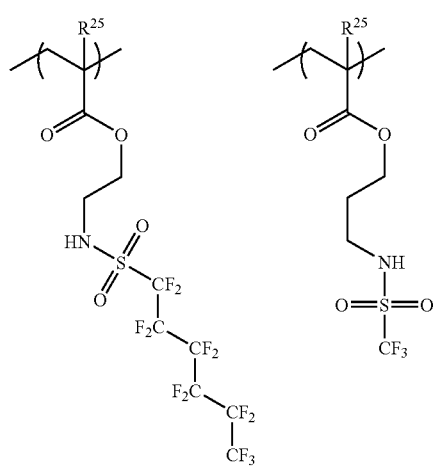
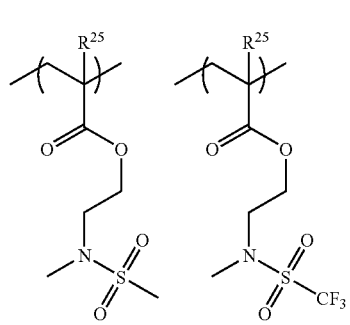
-continued
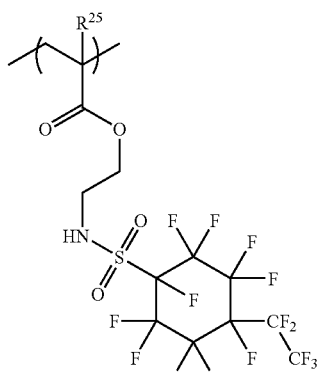
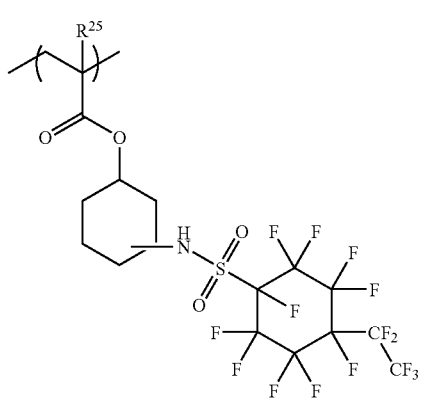
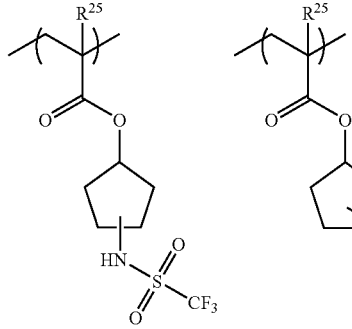
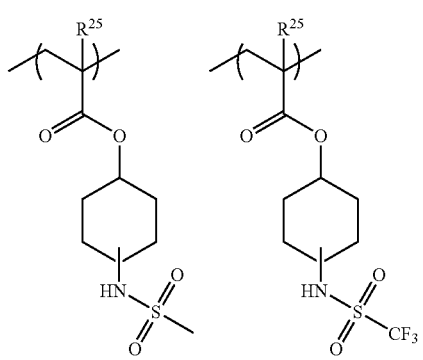

-continued
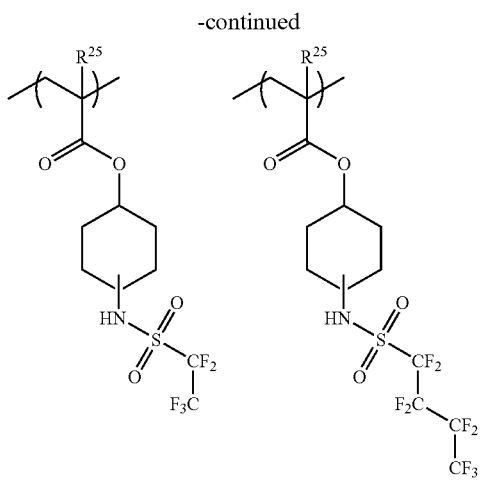
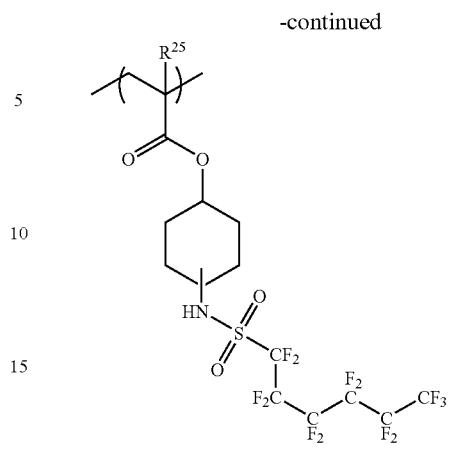
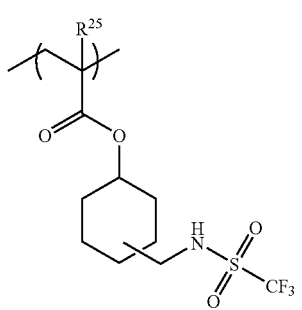
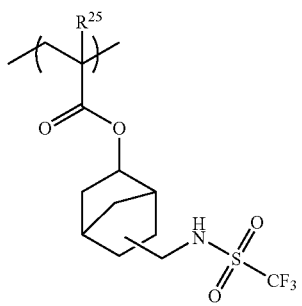
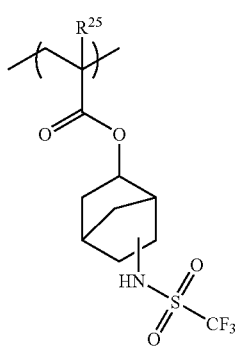
Examples of the repeating unit represented by the general formula (9) may include without limitation the following units. In the following formulae, $R^{28c}$ represents any one of a hydrogen atom, a fluorine atom, a methyl group, and a trifluoromethyl group.
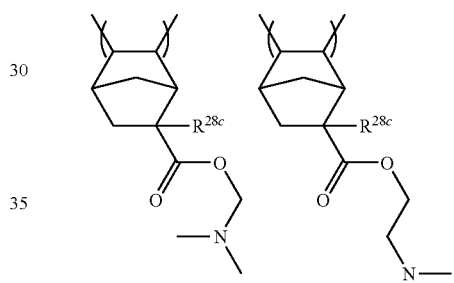
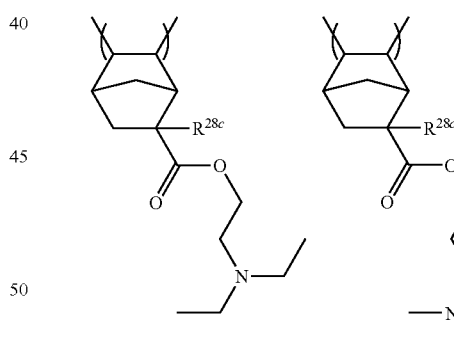
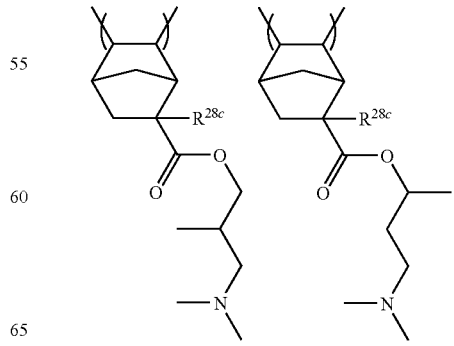

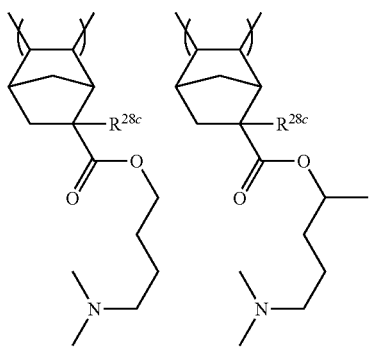
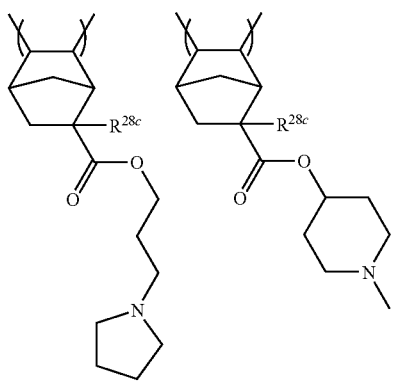
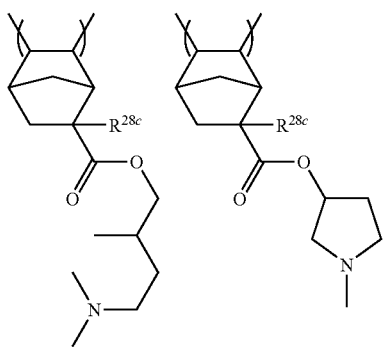
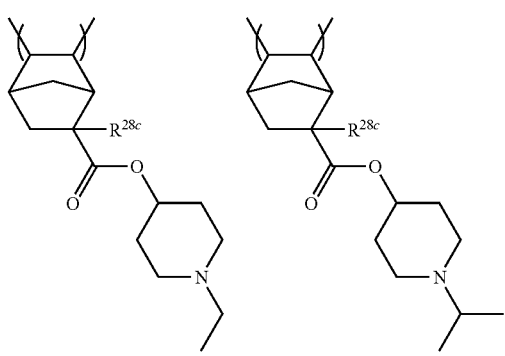
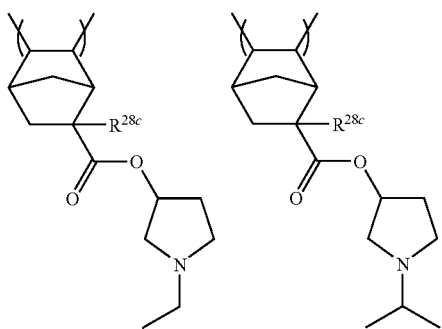
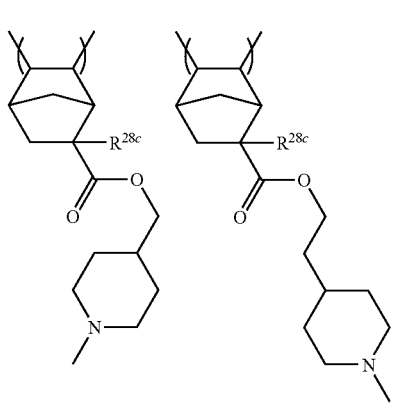
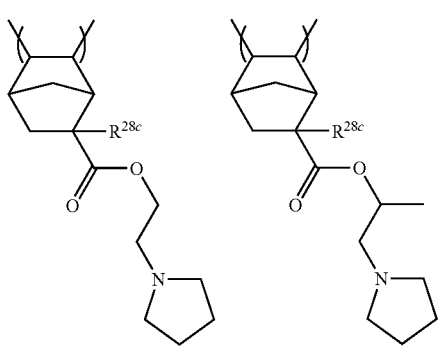
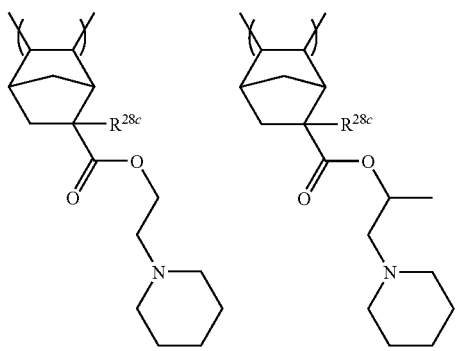

-continued
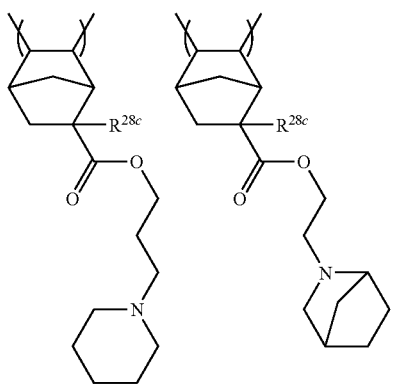
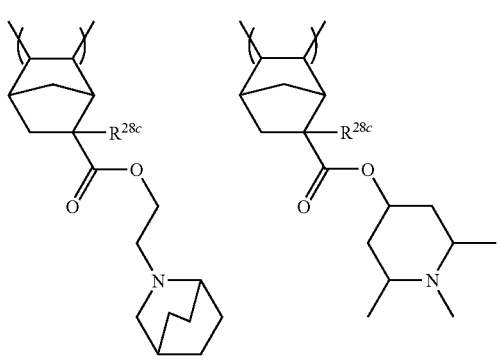
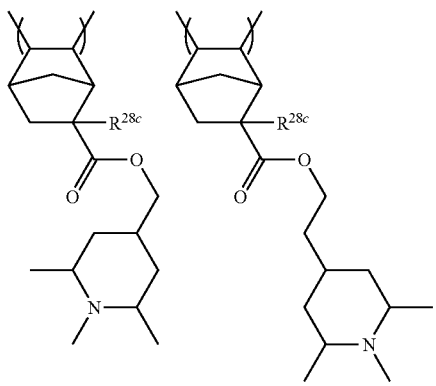
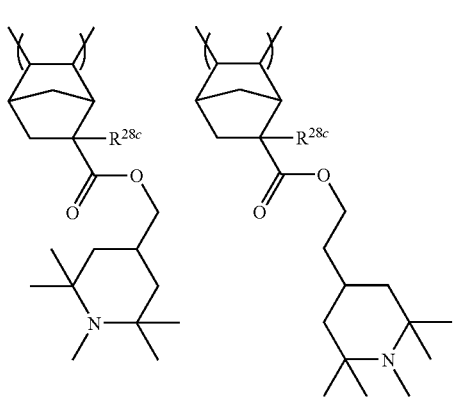
-continued
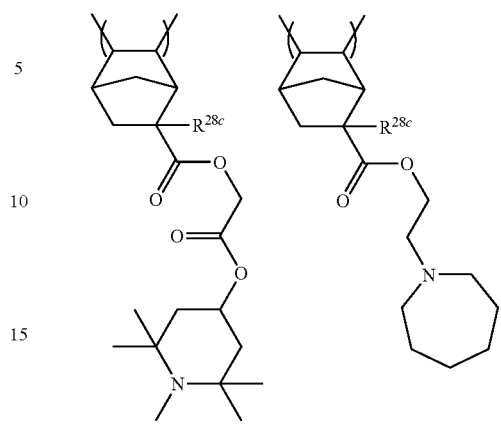
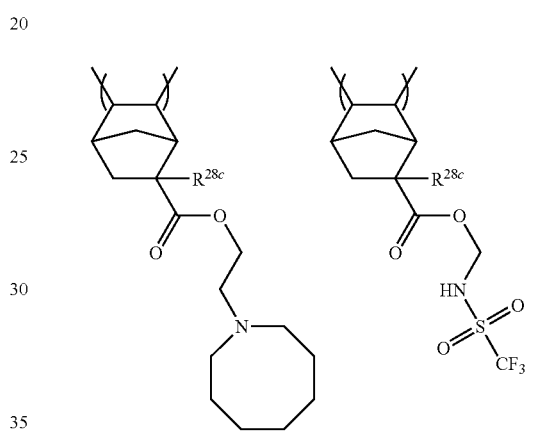
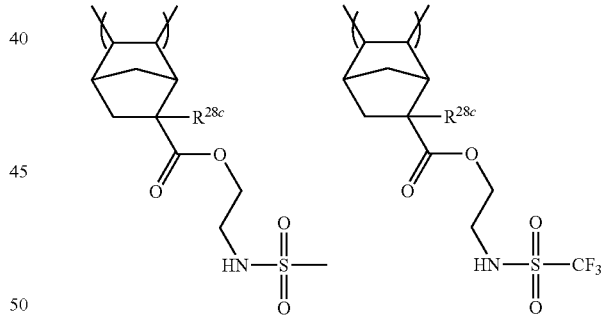
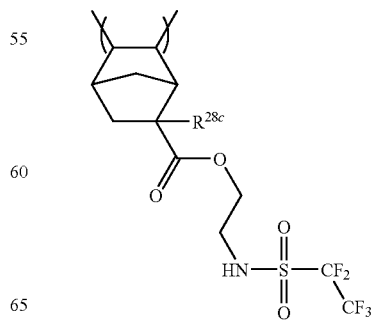

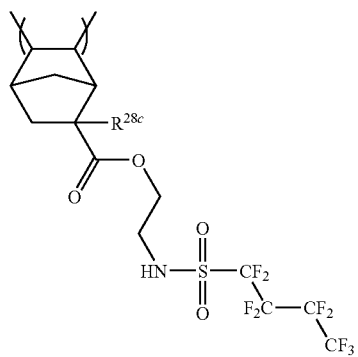
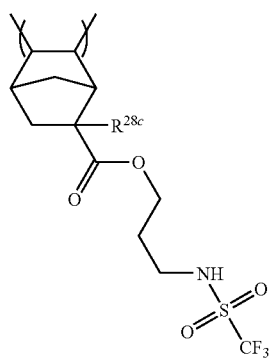
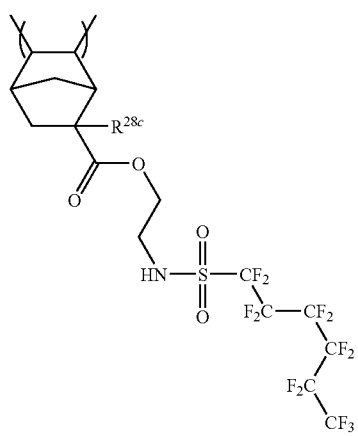
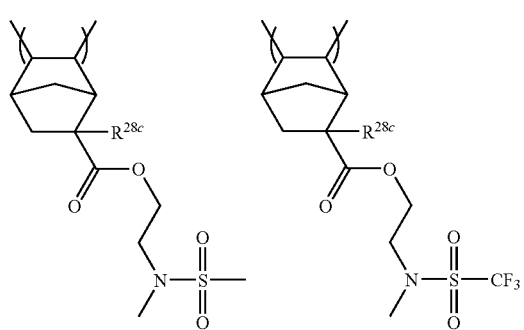
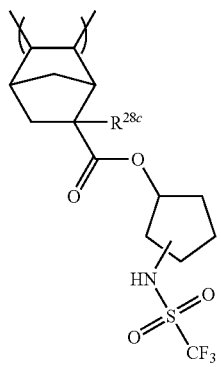
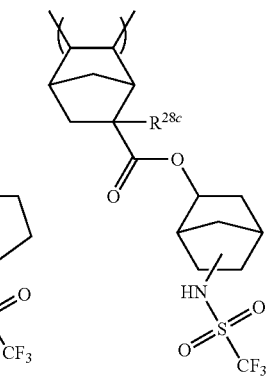
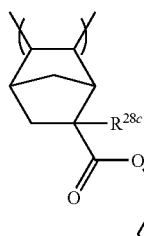
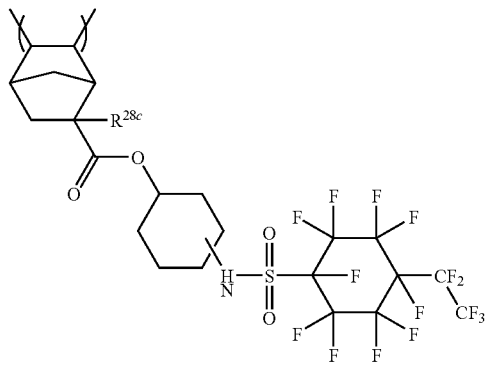
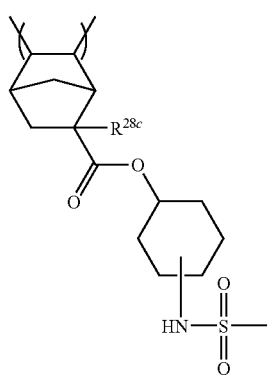

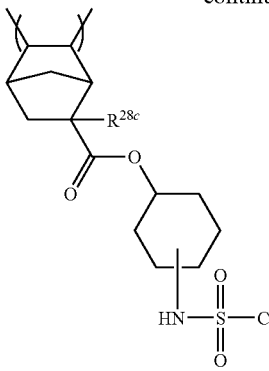
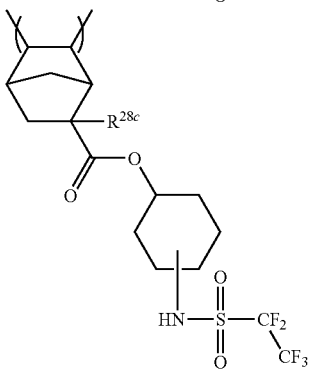
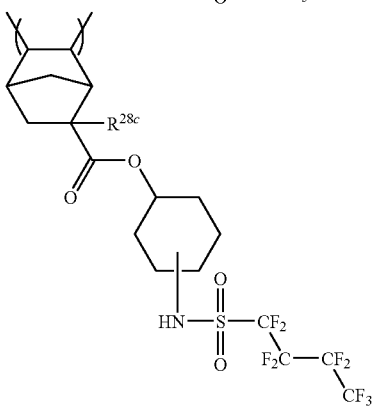
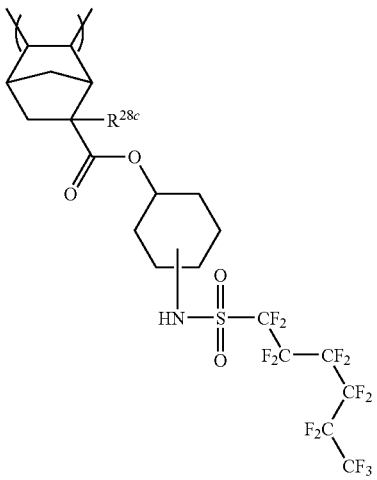

The unit (P) of the polymer represented by the general formula (1) according to the present invention can be synthesized, for example, by addition polymerization. When the unit (P) of the polymer is synthesized, there are used general polymerization methods such as radical copolymerization using an initiator such as 2,2'-azobisisobutyronitrile (hereafter, abbreviated as AIBN), or ionic polymerization (anionic polymerization) using lithium alkyl or the like. These polymerizations may be conducted according to their standard procedures. The unit (P) of the polymer according to the present invention is preferably synthesized by radical copolymerization. Polymerization conditions thereof depend on the type of an initiator, temperature, pressure, concentration, solvent, additive, and the like.

Examples of the radical polymerization initiator may include without limitation: azo compounds such as AIBN, 2,2'-azobis (4-methoxy-2,4-dimethyl valeronitrile), 2,2'-azobis (2,4-dimethyl valeronitrile), 2,2'-azobis (2,4,4-trimethyl pentane) or 2,2'-azobis(isobutyric acid) dimethyl; peroxide compounds such as tert-butyl peroxy pivalate, lauroyl peroxide, benzoyl peroxide, or tert-butyl peroxy laurate; water-soluble initiators such as potassium persulfate; redox initiators composed of peroxide such as potassium persulfate or hydrogen peroxide, and a reducing agent such as sodium sulfite; and the like. The amount of the polymerization initiator to be used can be changed adequately depending on the type of an initiator, polymerization conditions. The amount is normally 0.001 to 10 mole %, and in particular 0.01 to 5 mole % to the total amounts of monomers to be polymerized.

The feature of the polymer represented by the general formula (1) in the resist top coat composition according to the present invention is to have an amino group or a sulfonamide group at a polymer end. As a specific example of a method for introducing the amino group or the sulfonamide group is to use a chain transfer agent that has an amino group or a sulfonamide group and that is represented by the following general formula (1-1),

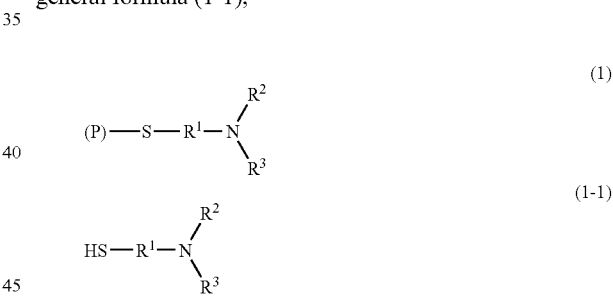

In the formulae (1) and (1-1), the (P) represents a unit obtained by polymerization of a polymerizable compound;

$R^1$ represents a single bond or a linear, branched or cyclic alkylene group having 1-10 carbon atoms;

$R^2$ and $R^3$ independently represent any one of a hydrogen atom, a linear, branched or cyclic alkyl group having 1-20 carbon atoms, and $-SO_2R^4$;

either $R^1$ and $R^2$, $R^1$ and $R^3$, or $R^2$ and $R^3$ may be linked to form a ring; and $R^4$ represents any one of a linear, branched or cyclic alkyl group having 1-10 carbon atoms and an aryl group having 6-20 carbon atoms; the alkyl group and the aryl group may contain one or more groups selected from an ether group and an ester group; and hydrogen atoms of the alkyl group and the aryl group may be totally or partially substituted with a fluorine atom.

When the chain transfer agent represented by the general formula (1-1) is added to a polymerization system, a propagating radical of a polymer extracts hydrogen atoms of thiol. And a newly generated radical is added to a monomer, and polymerization reaction is resumed. As a result, a polymer that has an amino group or a sulfonamide group at a polymer end and that is represented by the general formula (1) is generated.

Such a chain transfer agent preferably has a structure including a thiol group which has chain transfer capabilities and an amino group or a sulfonamide group in a molecule. Examples of the chain transfer agent are shown below, however, the chain transfer agent is not limited thereto.

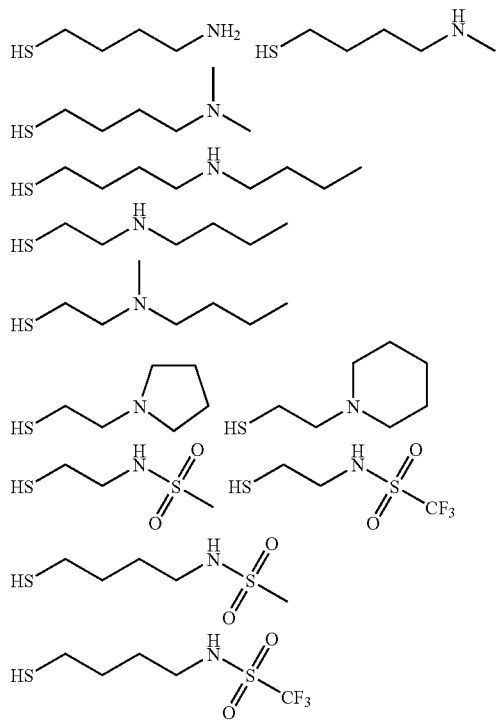

The amount of a chain transfer agent having an amino group or a sulfonamide group to be added may be properly changed depending on polymerization conditions, the type of the chain transfer agent, and so on. And the amount is preferably 0.01 to 10 mole %, and more preferably 0.1 to 5 mole % to the total number of moles of monomers to be polymerized.

In the case of synthesizing a polymer represented by the general formula (1) according to the present invention, known chain transfer agents such as dodecyl mercaptan or 2-mercaptoethanol may be used in combination with the above chain transfer agent for the purpose of controlling the molecular weight of the polymer. In this case, the amount of such chain transfer agents to be added is preferably 0.01 to 10 mole % to the total number of moles of monomers to be polymerized.

In the case of synthesizing a polymer represented by the general formula (1) according to the present invention, a solvent may be used if necessary. As a solvent used for polymerization, solvents that do not inhibit polymerization reaction are preferably used. Representative examples thereof are esters such as ethyl acetate, n-butyl acetate, or γ-butyrolactone; ketones such as acetone, methyl ethyl ketone, or methyl isobutyl ketone; aliphatic or aromatic hydrocarbons such as toluene, xylene, or cyclohexane; alcohols such as isopropyl alcohol, or ethylene glycol monomethyl ether; and ethers such as diethyl ether, dioxane, or tetrahydrofuran. These solvents may be used alone or in admixture. The amount of a polymerization solvent to be used may be changed properly depending on polymerization conditions such as a target polymerization degree (molecular weight), the amount of an initiator to be added, or polymerization temperature. Usually, a solvent is added so that monomers to be polymerized have a concentration of 0.1 to 95 mass %, in particular, 5 to 90 mass %.

The reaction temperature of the polymerization reaction may be changed properly depending on the type of a polymerization initiator or the boiling point of a solvent. In general, the reaction temperature is preferably 20 to 200 degrees C., and in particular, 50 to 140 degrees C. Reaction vessels used for such polymerization reaction are not particularly restricted.

As for a method for removing an organic solvent or water, which is a medium, from solutions or dispersions of polymers obtained above, any known method may be used. Examples of such a method may include reprecipitation and filtration, heating to distill under reduced pressure, and so on.

A polymer that is represented by the general formula (1) according to the present invention preferably has a weight average molecular weight (Mw), measured by gel permeation chromatography (GPC) relative to polystyrene, of 1,000 to 500,000, and more preferably 2,000 to 30,000. The polymer having a Mw of 1,000 or more has less possibility to cause mixing with a photoresist film composition or to dissolve in water. The polymer having a Mw of 500,000 or less has less possibility to cause problems in forming a film after being spin-coated or to have reduced alkali-solubility.

In a polymer that is represented by the general formula (1) according to the present invention, where U1 denotes the total number of moles of monomers corresponding to the units represented by the general formula (2) or (3); U2 denotes the total number of moles of monomers corresponding to the units represented by the general formula (4) or (5); U3 denotes the total number of moles of monomers corresponding to the repeating units represented by the general formula (6) or (7); U4 denotes the total number of moles of monomers corresponding to the repeating units represented by the general formula (8) or (9); and U1+U2+U3+U4=U, U, U1, U2, U3, and U4 preferably satisfy the following relationship:

$0 \leq U1/U \leq 1.0$, more preferably $0 \leq U1/U \leq 0.9$;

$0 \leq U2/U \leq 1.0$, more preferably $0 \leq U2/U \leq 0.9$;

$0 \leq U3/U \leq 0.6$, more preferably $0 \leq U3/U \leq 0.3$;

$0 \leq U4/U \leq 0.2$, more preferably $0 \leq U4/U \leq 0.1$; and $0 < U1+U2+U3+U4$.

A polymer that is represented by the general formula (1) according to the present invention may be used as a base resin of a resist top coat composition for liquid immersion lithography. In addition, other polymers may be mixed with the base resin for the purpose of altering a film in dynamic properties, thermal properties, alkali-solubility, water repellent property, water-sliding property, and other properties. In this case, the ratios of polymers to be mixed with the base resin are not particularly restricted, and the base resin may be mixed with known polymers and the like used for resists or topcoats in arbitrary ratios.

In addition, as to the resist top coat composition according to the present invention, a polymer represented by the general formula (1) and the like are preferably dissolved in a solvent. In this case, in view of performance in forming a film by the spin-coating method, it is preferable that the solvent is used so that the concentration of the polymer becomes 0.1 to 20 mass %, and particularly 0.5 to 10 mass %.

The solvent to be used is not particularly restricted, however, solvents that do not dissolve photoresist films are preferable. Examples of solvents that dissolve photoresist films may include solvents used for resists: ketones such as cyclohexanone or methyl-2-n-amyl ketone; alcohols such as 3-methoxy butanol, 3-methyl-3-methoxy butanol, 1-methoxy-2-propanol, or 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, or diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, or propylene glycol mono tert-butyl ether acetate; and the like.

Examples of the solvents that are preferably used in the present invention because the solvents do not dissolve photoresist films are nonpolar solvents such as higher alcohols having 4 or more carbon atoms, toluene, xylene, anisole, hexane, cyclohexane, decane, and ether compounds. In particular, higher alcohols having 4 or more carbon atoms or ether compounds having 8 to 12 carbon atoms are preferably used. Specifically, examples thereof may include: 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether. These solvents may be used alone or in admixture. And the solvents are not restricted thereto.

In addition, fluorinated solvents may also be preferably used in the present invention because fluorinated solvents do not dissolve photoresist films.

Examples of such fluorinated solvents may include: 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenon, 2,4-difluorotoluene, trifluoroacetaldehyde ethylhemiacetal, trifluoroacetamide, trifluoroethanol, 2,2,2-trifluoroethyl butyrate, ethylheptafluoro butyrate, ethylheptafluoro butyl acetate, ethylhexafluoro glutarylmethyl, ethyl-3-hydroxy-4,4,4-trifluoro butyrate, ethyl-2-methyl-4,4,4-trifluoro acetoacetate, ethyl pentafluoro benzoate, ethyl pentafluoro propionate, ethyl pentafluoro propionyl acetate, ethyl perfluoro octanoate, ethyl-4,4,4-trifluoro acetoacetate, ethyl-4,4,4-trifluoro butyrate, ethyl-4,4,4-trifluoro crotonate, ethyltrifluoro sulfonate, ethyl-3-(trifluoromethyl)butyrate, ethyltrifluoro pyruvate, S-ethyl trifluoro acetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoro acetoacetate, methylperfluoro denanoate, methylperfluoro(2-methyl-3-oxahexanoate), methylperfluoro nonanoate, methylperfluoro octanoate, methyl-2,3,3,3-tetrafluoropropionate, methyltrifluoro acetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro (2,5-dimethyl-3,6-dioxaneanionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluoro octanol, 1H,1H,2H,2H-perfluoro octanol, 2H-perfluoro-5,8,11,14-tetramethyl-3,6,9,12,15-pentaoxaoctadecane, perfluoro tributylamine, perfluoro trihexylamine, methyl perfluoro-2,5,8-trimethyl-3,6,9-trioxadodecanoate, perfluoro tripentylamine, perfluoro tripropylamine, 1H,1H,2H,3H,3H-perfluoroundecane-1,2-diol, trifluoro butanol 1,1,1-trifluoro-5-methyl-2,4-hexanedione, 1,1,1-trifluoro-2-propanol, 3,3,3-trifluoro-1-propanol, 1,1,1-trifluoro-2-propylacetate, perfluoro butyl tetrahydrofuran, perfluoro(butyl tetrahydrofuran), perfluoro decalin, perfluoro (1,2-dimethylcyclohexane), perfluoro (1,3-dimethylcyclohexane), propylene glycol trifluoromethyl ether acetate, propylene glycol methyl ether trifluoromethyl acetate, butyl trifluoromethyl acetate, methyl 3-trifluoromethoxy propionate, perfluoro cyclohexanone, propylene glycol trifluoromethyl ether, butyl trifluoro acetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, 4,4,4-trifluoro-1-butanol, and the like. These solvents may be used alone or in admixture. However, the fluorinated solvents are not restricted thereto.

Next, a patterning process according to the present invention will be explained.

The patterning process according to the present invention comprises: at least, a step of forming a photoresist film on a substrate; a step of forming a resist top coat on the photoresist film by using the resist top coat composition according to the present invention; a step of exposing the substrate; and a step of developing the substrate with a developer.

First, a photoresist film is formed on a substrate.

Examples of a method for forming the film are spin-coating method and the like. When the photoresist film is formed, for the purpose of reducing the amount of dispensing a photoresist film composition in spin-coating, the photoresist film composition is preferably dispensed and spin-coated on a substrate which is wet in advance with a photoresist solvent or a solution which is combined with a photoresist solvent (For example, see Japanese Publication of Unexamined Application No. 09-246173). This improves spreading of a photoresist film composition solution over a substrate, thereby reducing the amount of dispensing the photoresist film composition.

In a patterning process using the resist top coat composition according to the present invention, the type of the photoresist film composition for forming an underlying photoresist film is not particularly restricted. A positive type or a negative type is usable, a normal hydrocarbon monolayer resist composition is also usable, and a bilayer (multilayer) photoresist film composition containing silicon atoms or the like is also usable.

Preferably used photoresist film compositions for KrF exposure contain as a base polymer polyhydroxystyrene or polyhydroxystyrene-(meth)acrylate copolymer in which hydrogen atoms of hydroxy groups or carboxyl groups may be totally or partially substituted with an acid labile group.

In addition, photoresist film compositions for ArF exposure are required to have non-aromatic structures as a base resin. Specifically, preferred examples of the photoresist film compositions contain one or more polymers selected from copolymers of (meth)acrylic acid derivatives; alternating copolymers of norbornene derivatives and maleic anhydride; copolymers of norbornene derivatives, maleic anhydride and (meth)acrylic acid derivatives; alternating copolymers of tetracyclo dodecene derivatives and maleic anhydride; copolymers of tetracyclo dodecene derivatives, maleic anhydride and (meth)acrylic acid derivatives; alternating copolymers of norbornene derivatives and maleimide derivatives; copolymers of norbornene derivatives, maleimide derivatives and (meth)acrylic acid derivatives; alternating polymers of tetracyclo dodecene derivatives and maleimide derivatives; copolymers of tetracyclo dodecene derivatives, maleimide derivatives and (meth)acrylic acid derivatives; polynorbornene derivatives; and ring opening metathesis polymers.

Second, a resist top coat is formed on the photoresist film by using the resist top coat composition according to the present invention.

Examples of a method for forming the film are spin-coating method and the like. The thickness of the resist top coat to be formed is preferably in the range of 10 to 500 nm. In spin-coating the resist top coat composition, use of a process similar to that is used in forming the photoresist film is possible, and the surface of the photoresist film may be wet with a solvent prior to application of the resist top coat composition for the purpose of reducing the amount of dispensing the resist top coat composition. As a method to wet the surface of the photoresist film, spin-coating method or vapor prime method may be used, and spin-coating method is generally used. A solvent that is used for wetting the photoresist film is more preferably selected from the higher alcohols, the ethers, and the fluorinated solvents, which do not dissolve photoresist films.

Incidentally, in the case of conducting exposure with liquid immersion lithography as described later, for the purpose of preventing water from reaching the back surface of a substrate or preventing leaching from a substrate, what are important are the presence or absence of cleaning of the edge or the back surface of the substrate and the method of the cleaning. Then, for example, the resist top coat is formed by spin-coating method, and then the film may be baked in the range of 40 to 130 degrees C. for 10 to 300 seconds to evaporate a solvent. By the way, although edge cleaning is conducted at the time of forming photoresist films in the case of or dry exposure, conducting the edge cleaning is not preferable in liquid immersion exposure because conducting the edge cleaning can result in remaining of water on the edge portion of the hydrophilic surface of the substrate. Therefore, the edge cleaning may not be conducted at the time of spin-coating the resist top coat.

Next, exposure is conducted.

As a method of conducting exposure, there may be conducted liquid immersion lithography in which a gap between a projection lens and a resist top coat is filled with liquid or dry exposure under air or nitrogen atmosphere.

In the case of liquid immersion lithography, as the liquid with which the gap between a projection lens and a substrate is filled, water is preferably used. In addition, exposure is preferably conducted by using a light source having an exposure wavelength in the range of 180 to 250 nm, for example, KrF excimer laser (248 nm) or ArF excimer laser (193 nm).

Next, development is conducted.

In the step of developing a substrate, for example, development is conducted with an alkaline developer for 10 to 300 seconds. As the alkaline developer, generally and widely used is 2.38 mass % aqueous solution of tetramethylammonium hydroxide.

In the step of developing a substrate is preferably conducted by developing the substrate with an alkaline developer to form a resist pattern on the photoresist film and simultaneously to strip the resist top coat on the photoresist film. This makes it possible to strip the resist top coat more easily without additional installation of equipment for stripping the resist top coat to conventional equipment.

In addition, after the exposure and before the development, post exposure baking (PEB) is preferably conducted. In the case of liquid immersion lithography using water, before PEB is conducted, water can remain on the resist top coat. When PEB is conducted in the state that water remains on the resist top coat, water can permeate into the resist top coat and extract acid in the photoresist film, whereby there are possibilities that excellent patterns cannot be formed. Then, in order to avoid such situation, water on the resist top coat is preferably removed completely prior to conducting PEB. As a method to remove the water, there are methods of spindrying, purging the surface of the resist top coat with dry air or nitrogen, optimizing the shape of a nozzle for recovering water on a stage and a water recovering process, and so on. Furthermore, designing and using a composition having excellent water repellent property and water-sliding property as the resist top coat composition is effective for separating water.

Incidentally, in addition to the above processes, other various processes, such as an etching process, a resist removing process or a cleaning process may be naturally conducted.

EXAMPLE

Hereinafter, the present invention will be explained further in detail with reference to Examples, Comparative Examples and so on. However, the present invention is not limited by these descriptions.

Incidentally, in Examples, GPC denotes gel permeation chromatography, and weight average molecular weight (Mw) and number average molecular weight (Mn) in relative to polystyrene were measured with GPC.

Hereafter, there are shown structural formulae of monomers (monomers 1 to 11) and chain transfer agents (CTA1 and CTA2), which were used in Polymer Synthetic Examples and Comparative Synthetic Example described later.

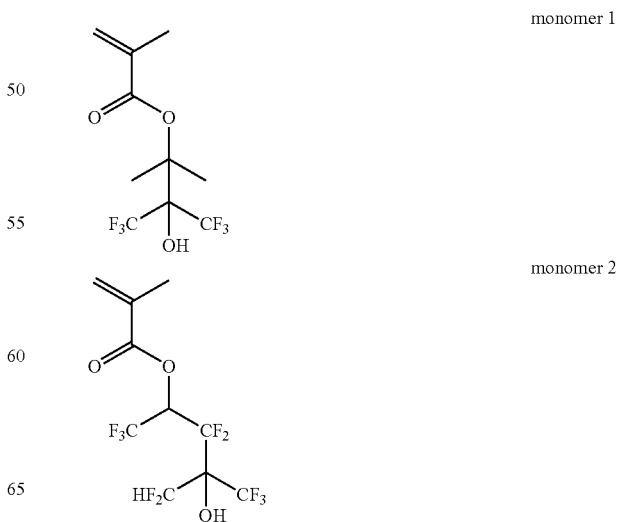

-continued monomer 3
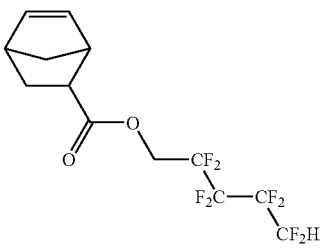

monomer 4 monomer 5
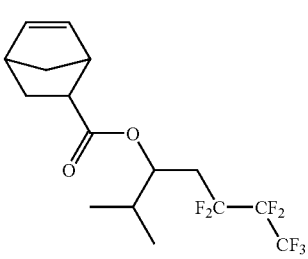

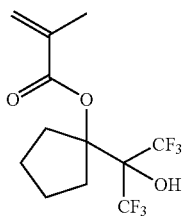

monomer 6

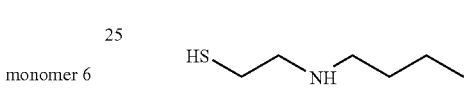 CTA1 monomer 7

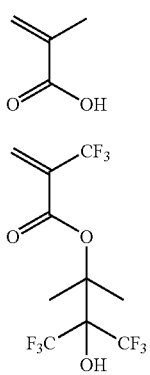

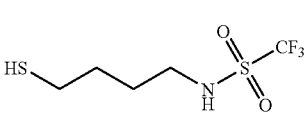 CTA2 monomer 8

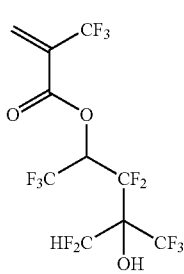

monomer 9

Polymer Synthetic Example 1

Copolymerization of Monomer 1 and Monomer 7 (80/20) Using CTA1 (1 mol %)

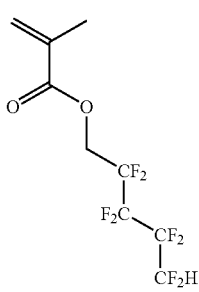

In a flask under a nitrogen atmosphere were placed 79.68 g of monomer 1, 20.32 g of monomer 7, 2.34 g of 2,2'-azobis (isobutyric acid) dimethyl, 0.45 g of CTA1, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature at 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 92.5 g of the target polymer (polymer 1). Analysis of the polymer composition by $^1$H-NMR revealed that composition ratio of the monomer 1 and monomer 7 in the copolymer was 79/21 mole %, and the amount of introduced CTA1 was 0.95 mole %. In addition, GPC measurement of the obtained copolymer

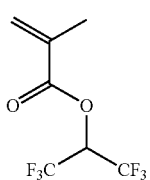

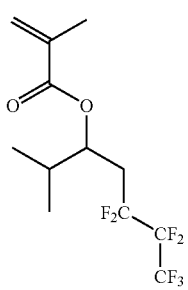

revealed that weight average molecular weight (Mw) relative to polystyrene was 7,800, and distribution (Mw/Mn) was 1.6.

Polymer Synthetic Example 2

Copolymerization of Monomer 1 and Monomer 7 (80/20) Using CTA2 (1 mol %)

In a flask under a nitrogen atmosphere were placed 79.68 g of monomer 1, 20.32 g of monomer 7, 2.34 g of 2,2'-azobis (isobutyric acid) dimethyl, 0.80 g of CTA2, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 90.5 g of the target polymer (polymer 2). Analysis of the polymer composition by $^1$H-NMR revealed that composition ratio of the monomer 1 and monomer 7 in the copolymer was 79/21 mole %, and the amount of introduced CTA2 was 0.90 mole %. In addition, GPC measurement of the obtained copolymer revealed that weight average molecular weight (Mw) relative to polystyrene was 7,700, and distribution (Mw/Mn) was 1.6.

Polymer Synthetic Example 3

Copolymerization of Monomer 1 and Monomer 8 (80/20) Using CTA1 (1 mol %)

In a flask under a nitrogen atmosphere were placed 83.29 g of monomer 1, 16.71 g of monomer 8, 2.45 g of 2,2'-azobis (isobutyric acid) dimethyl, 0.47 g of CTA1, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 91.5 g of the target polymer (polymer 3). Analysis of the polymer composition by $^1$H-NMR revealed that composition ratio of the monomer 1 and monomer 8 in the copolymer was 79/21 mole %, and the amount of introduced CTA1 was 0.93 mole %. In addition, GPC measurement of the obtained copolymer revealed that weight average molecular weight (Mw) relative to polystyrene was 7,900, and distribution (Mw/Mn) was 1.6.

Polymer Synthetic Example 4

Copolymerization of Monomer 1 and Monomer 8 (80/20) Using CTA2 (1 mol %)

In a flask under a nitrogen atmosphere were placed 83.29 g of monomer 1, 16.71 g of monomer 8, 2.45 g of 2,2'-azobis (isobutyric acid) dimethyl, 0.84 g of CTA2, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 92.3 g of the target polymer (polymer 4). Analysis of the polymer composition by $^1$H-NMR revealed that composition ratio of the monomer 1 and monomer 8 in the copolymer was 79/21 mole %, and the amount of introduced CTA2 was 0.93 mole %. In addition, GPC measurement of the obtained copolymer revealed that weight average molecular weight (Mw) relative to polystyrene was 7,900, and distribution (Mw/Mn) was 1.6.

Polymer Synthetic Example 5

Copolymerization of Monomer 1 and Monomer 9 (80/20) Using CTA1 (1 mol %)

In a flask under a nitrogen atmosphere were placed 78.40 g of monomer 1, 21.60 g of monomer 9, 2.30 g of 2,2'-azobis (isobutyric acid) dimethyl, 0.44 g of CTA1, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 93.5 g of the target polymer (polymer 5). Analysis of the polymer composition by $^1$H-NMR revealed that composition ratio of the monomer 1 and monomer 9 in the copolymer was 79/21 mole %, and the amount of introduced CTA1 was 0.92 mole %. In addition, GPC measurement of the obtained copolymer revealed that weight average molecular weight (Mw) relative to polystyrene was 7,800, and distribution (Mw/Mn) was 1.6.

Polymer Synthetic Example 6

Copolymerization of Monomer 1 and Monomer 9 (80/20) Using CTA2 (1 mol %)

In a flask under a nitrogen atmosphere were placed 78.40 g of monomer 1, 21.60 g of monomer 9, 2.30 g of 2,2'-azobis (isobutyric acid) dimethyl, 0.79 g of CTA2, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 92.8 g of the target polymer (polymer 6). Analysis of the polymer composition by $^1$H-NMR revealed that composition ratio of the monomer 1 and monomer 9 in the copolymer was 78/22 mole %, and the amount of introduced CTA2 was 0.94 mole %. In addition, GPC measurement of the obtained copolymer revealed that weight average molecular weight (Mw) relative to polystyrene was 7,900, and distribution (Mw/Mn) was 1.6.

Polymer Synthetic Example 7

Copolymerization of Monomer 2 and Monomer 7 (80/20) Using CTA1 (1 mol %)

In a flask under a nitrogen atmosphere were placed 82.99 g of monomer 2, 17.01 g of monomer 7, 1.96 g of 2,2'-azobis (isobutyric acid) dimethyl, 0.38 g of CTA1, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 93.1 g of the target polymer (polymer 7). Analysis of the polymer composition by $^1$H-NMR revealed that composition ratio of the monomer 2 and monomer 7 in the copolymer was 79/21 mole %, and the amount of introduced CTA1 was 0.95 mole %. In addition, GPC measurement of the obtained copolymer revealed that weight average molecular weight (Mw) relative to polystyrene was 7,900, and distribution (Mw/Mn) was 1.6.

Polymer Synthetic Example 8

Copolymerization of Monomer 2 and Monomer 7 (80/20) Using CTA2 (1 mol %)

In a flask under a nitrogen atmosphere were placed 82.99 g of monomer 2, 17.01 g of monomer 7, 1.96 g of 2,2'-azobis (isobutyric acid) dimethyl, 0.67 g of CTA2, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 92.9 g of the target polymer (polymer 8). Analysis of the polymer composition by $^1$H-NMR revealed that composition ratio of the monomer 2 and monomer 7 in the copolymer was 79/21 mole %, and the amount of introduced CTA2 was 0.94 mole %. In addition, GPC measurement of the obtained copolymer revealed that weight average molecular weight (Mw) relative to polystyrene was 7,900, and distribution (Mw/Mn) was 1.6.

Polymer Synthetic Example 9

Copolymerization of Monomer 2 and Monomer 9 (80/20) Using CTA1 (1 mol %)

In a flask under a nitrogen atmosphere were placed 81.87 g of monomer 2, 18.13 g of monomer 9, 1.93 g of 2,2'-azobis (isobutyric acid) dimethyl, 0.37 g of CTA1, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 94.1 g of the target polymer (polymer 9). Analysis of the polymer composition by $^1$H-NMR revealed that composition ratio of the monomer 2 and monomer 9 in the copolymer was 79/21 mole %, and the amount of introduced CTA1 was 0.94 mole %. In addition, GPC measurement of the obtained copolymer revealed that weight average molecular weight (Mw) relative to polystyrene was 7,900, and distribution (Mw/Mn) was 1.6.

Polymer Synthetic Example 10

Copolymerization of Monomer 2 and Monomer 9 (80/20) Using CTA2 (1 mol %)

In a flask under a nitrogen atmosphere were placed 81.87 g of monomer 2, 18.13 g of monomer 9, 1.93 g of 2,2'-azobis(isobutyric acid) dimethyl, 0.66 g of CTA2, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 93.9 g of the target polymer (polymer 10). Analysis of the polymer composition by $^1$H-NMR revealed that composition ratio of the monomer 2 and monomer 9 in the copolymer was 79/21 mole %, and the amount of introduced CTA2 was 0.94 mole %. In addition, GPC measurement of the obtained copolymer revealed that weight average molecular weight (Mw) relative to polystyrene was 7,900, and distribution (Mw/Mn) was 1.6.

Polymer Synthetic Example 11

Polymerization of Monomer 3 Using CTA1 (1 mol %)

In a flask under a nitrogen atmosphere were placed 100.00 g of monomer 3, 2.16 g of 2,2'-azobis(isobutyric acid) dimethyl, 0.42 g of CTA1, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 94.0 g of the target polymer (polymer 11). Analysis of the polymer composition by $^1$H-NMR revealed the amount of introduced CTA1 was 0.96 mole %. In addition, GPC measurement of the obtained copolymer revealed that weight average molecular weight (Mw) relative to polystyrene was 7,900, and distribution (Mw/Mn) was 1.6.

Polymer Synthetic Example 12

Polymerization of Monomer 3 Using CTA2 (1 mol %)

In a flask under a nitrogen atmosphere were placed 81.87 g of monomer 3, 2.16 g of 2,2'-azobis(isobutyric acid) dimethyl, 0.74 g of CTA2, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 92.9 g of the target polymer (polymer 12). Analysis of the polymer composition by $^1$H-NMR revealed the amount of introduced CTA2 was 0.97 mole %. In addition, GPC measurement of the obtained copolymer revealed that weight average molecular weight (Mw) relative to polystyrene was 7,900, and distribution (Mw/Mn) was 1.6.

Polymer Synthetic Example 13

Copolymerization of Monomer 4 and Monomer 7 (50/50) Using CTA1 (1 mol %)

In a flask under a nitrogen atmosphere were placed 22.29 g of monomer 4, 77.71 g of monomer 7, 3.40 g of AIBN, 0.61 g of 2-mercaptoethanol, 0.69 g of CTA1, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 92.1 g of the target polymer (polymer 13). Analysis of the polymer composition by $^1$H-NMR revealed that composition ratio of the monomer 4 and monomer 7 in the copolymer was 49/51 mole %, and the amount of introduced CTA1 was 0.95 mole %. In addition, GPC measurement of the obtained copolymer revealed that weight average molecular weight (Mw) relative to polystyrene was 8,100, and distribution (Mw/Mn) was 1.6.

Polymer Synthetic Example 14

Copolymerization of Monomer 4 and Monomer 7 (50/50) Using CTA2 (1 mol %)

In a flask under a nitrogen atmosphere were placed 22.29 g of monomer 4, 77.71 g of monomer 7, 3.40 g of AIBN, 0.61 g of 2-mercaptoethanol, 1.23 g of CTA2, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 92.0 g of the target polymer (polymer 14). Analysis of the polymer composition by $^1$H-NMR revealed that composition ratio of the monomer 4 and monomer 7 in the copolymer was 49/51 mole %, and the amount of introduced CTA2 was 0.97 mole %. In addition, GPC measurement of the obtained copolymer revealed that weight average molecular weight (Mw) relative to polystyrene was 8,000, and distribution (Mw/Mn) was 1.6.

Polymer Synthetic Example 15

Copolymerization of Monomer 5 and Monomer 10 (70/30) Using CTA1 (1 mol %)

In a flask under a nitrogen atmosphere were placed 69.76 g of monomer 5, 30.24 g of monomer 10, and 142.8 g of γ-butyrolactone to prepare a monomer solution. Then to the solution were added 0.38 g of CTA1 and 3.42 g of lauroyl peroxide, and heated up to 65 degrees C. This polymer solution was stirred for 24 hours with maintaining the temperature at 65 degrees C. After aging of the solution was complete, the solution was cooled to room temperature. Isopropyl ether was added thereto so that the concentration of the polymer solution to be 40%. Then this solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 90.1 g of the target polymer (polymer 15). Analysis of the polymer composition by $^1$H-NMR revealed that composition ratio of the monomer 5 and monomer 10 in the copolymer was 69/31 mole %, and the amount of introduced CTA1 was 0.92 mole %. In addition, GPC measurement of the obtained copolymer revealed that weight average molecular weight (Mw) relative to polystyrene was 6,900, and distribution (Mw/Mn) was 1.6.

Polymer Synthetic Example 16

Copolymerization of Monomer 5 and Monomer 10 (70/30) Using CTA2 (1 mol %)

In a flask under a nitrogen atmosphere were placed 69.76 g of monomer 5, 30.24 g of monomer 10, and 142.8 g of γ-butyrolactone to prepare a monomer solution. Then to the solution were added 0.68 g of CTA2 and 3.42 g of lauroyl peroxide, and heated up to 65 degrees C. This polymer solution was stirred for 24 hours with maintaining the temperature at 65 degrees C. After aging of the solution was complete, the solution was cooled to room temperature. Isopropyl ether was added thereto so that the concentration of the polymer solution to be 40%. Then this solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 91.1 g of the target polymer (polymer 16). Analysis of the polymer composition by $^1$H-NMR revealed that composition ratio of the monomer 5 and monomer 10 in the copolymer was 69/31 mole %, and the amount of introduced CTA2 was 0.94 mole %. In addition, GPC measurement of the obtained copolymer revealed that weight average molecular weight (Mw) relative to polystyrene was 6,600, and distribution (Mw/Mn) was 1.6.

Polymer Synthetic Example 17

Copolymerization of Monomer 6 and Monomer 11 (70/30) Using CTA1 (1 mol %)

In a flask under a nitrogen atmosphere were placed 72.26 g of monomer 6, 27.74 g of monomer 11, and 142.8 g of γ-butyrolactone to prepare a monomer solution. Then to the solution were added 0.33 g of CTA1 and 2.94 g of lauroyl peroxide, and heated up to 65 degrees C. This polymer solution was stirred for 24 hours with maintaining the temperature at 65 degrees C. After aging of the solution was complete, the solution was cooled to room temperature. Isopropyl ether was added thereto so that the concentration of the polymer solution to be 40%. Then this solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 92.1 g of the target polymer (polymer 17). Analysis of the polymer composition by $^1$H-NMR revealed that composition ratio of the monomer 6 and monomer 11 in the copolymer was 69/31 mole %, and the amount of introduced CTA1 was 0.93 mole %. In addition, GPC measurement of the obtained copolymer revealed that weight average molecular weight (Mw) relative to polystyrene was 6,800, and distribution (Mw/Mn) was 1.6.

Polymer Synthetic Example 18

Copolymerization of Monomer 6 and Monomer 11 (70/30) Using CTA2 (1 mol %)

In a flask under a nitrogen atmosphere were placed 72.26 g of monomer 6, 27.74 g of monomer 11, and 142.8 g of γ-butyrolactone to prepare a monomer solution. Then to the solution were added 0.58 g of CTA2 and 2.94 g of lauroyl peroxide, and heated up to 65 degrees C. This polymer solution was stirred for 24 hours with maintaining the temperature at 65 degrees C. After aging of the solution was complete, the solution was cooled to room temperature. Isopropyl ether was added thereto so that the concentration of the polymer solution to be 40%. Then this solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 93.1 g of the target polymer (polymer 18). Analysis of the polymer composition by $^1$H-NMR revealed that composition ratio of the monomer 6 and monomer 11 in the copolymer was 69/31 mole %, and the amount of introduced CTA2 was 0.94 mole %. In addition, GPC measurement of the obtained copolymer revealed that weight average molecular weight (Mw) relative to polystyrene was 6,700, and distribution (Mw/Mn) was 1.6.

Comparative Synthetic Example 1

Copolymerization of Monomer 1 and Monomer 7 (75/25)

In a flask under a nitrogen atmosphere were placed 74.62 g of monomer 1, 25.38 g of monomer 7, 2.34 g of 2,2'-azobis(isobutyric acid) dimethyl, and 100.0 g of isopropyl alcohol to prepare a monomer solution having a solution temperature of 20 to 25 degrees C. In another flask under a nitrogen atmosphere was placed 50.0 g of isopropyl alcohol, and heated up to 80 degrees C. with stirring. Then to this flask was added dropwise the monomer solution with spending 4 hours. After the addition was complete, the polymer solution was stirred for 2 hours with maintaining the solution temperature of 80 degrees C. After aging of the solution was complete, the solution was cooled to room temperature. Thus obtained polymer solution was added dropwise to 4000 g of a water/methanol mixed solvent (mixture ratio: 7/1), and precipitated copolymer was filtered and taken. Thus obtained copolymer was washed with 600 g of an isopropyl ether/hexane mixed solvent (mixture ratio: 9/1) 4 times to separate a white solid. The white solid was dried in a vacuum at 50 degrees C. for 20 hours to obtain 90.5 g of the target polymer (comparative polymer 1). Analysis of the polymer composition by $^1$H-NMR revealed that composition ratio of the monomer 1 and monomer 7 in the copolymer was 74/26 mole %. In addition, GPC measurement of the obtained copolymer revealed that weight average molecular weight (Mw) relative to polystyrene was 9,300, and distribution (Mw/Mn) was 1.6.

EXAMPLES

Comparative Example

As polymers for resist top coat compositions, polymers 1 to 18 synthesized in the Polymer Synthetic Examples 1 to 18 and comparative polymer 1 synthesized in the Comparative Synthetic Example 1 were used.

Solutions of resist top coat compositions were prepared by dissolving 1.0 g of Polymers 1 to 18 and comparative polymer 1 in mixture solvents of 23 g of diisopentyl ether and 2 g of 2-metyl-1-buthanol and filtering these solutions through 0.2 micron polypropylene filters, respectively.

The solutions of resist top coat compositions were spin-coated on silicon substrates (silicon wafers), and baked at 100 degrees C. for 60 seconds to form resist top coats each having a thickness of 50 nm (TC-1 to TC-18, Comparative TC-1). The refractive index of each top coat at a wavelength of 193 nm was measured with a spectroscopic ellipsometer manufactured by J.A. Woollam Co., Inc. The results are shown in the following Table 1.

Next, silicon substrates on which the resist top coats were formed according to the above method were rinsed with pure water for 5 minutes, and change of the thickness of each film before and after the rinse was observed. The results are also shown in the following Table 1.

From the following Table 1, it has been established that the resist top coats TC-1 to 18 have high water repellency, and less prone to dissolve in water.

Next, silicon substrates on which the resist top coats were formed according to the above method were developed with 2.38 mass % aqueous solution of tetramethylammonium hydroxide (TMAH). And the thickness of each resist top coat after development was observed. The results are also shown in Table 1.

From the following Table 1, it has been established that the resist top coats TC-1 to 18 have high alkali solubility and can be stripped with an alkaline developer easily at the time of development.

Furthermore, silicon substrates on which the resist top coats were formed according to the above method were held horizontally, and 50 μL of pure water was dropped and a water droplet was formed on each top coat. Then each silicon substrate was tilted gradually by using Tilting base contact angle meter Drop Master 500 (manufactured by Kyowa Interface Science Co., Ltd.) and the angle (the sliding angle) of each substrate where the water droplet starts to slide, and the receding contact angle were measured. The results are also shown in Table 1.

Having a smaller sliding angle means that water is apt to flow on a top coat. Having a larger receding contact angle means that droplets are less prone to remain on a top coat even when a high-speed scanning is conducted for exposure. It has been established that introduction of amino groups or sulfonamide groups at polymer ends hardly affects the sliding angle or the receding contact angle of the resist top coats TC-1 to 18 in which amino groups or sulfonamide groups are introduced to polymer ends of the polymers (polymers 1 to 18) in comparison with the film (Comparative TC-1) in which no amino groups or sulfonamide groups are introduced at polymer ends.

TABLE 1

| Resist Top Coat | Polymers for Resist Top Coat | Refractive Index at 193 nm | Change of Film Thickness before and after Rinse (nm) | Film Thickness after Development (nm) | Sliding Angle (°) | Receding Contact Angle (°) |
|---|---|---|---|---|---|---|
| TC-1 | polymer 1 | 1.56 | 0 | 0 | 12 | 70 |
| TC-2 | polymer 2 | 1.57 | 0 | 0 | 11 | 71 |
| TC-3 | polymer 3 | 1.56 | 0 | 0 | 14 | 74 |
| TC-4 | polymer 4 | 1.56 | 0 | 0 | 13 | 75 |
| TC-5 | polymer 5 | 1.58 | 0 | 0 | 12 | 75 |
| TC-6 | polymer 6 | 1.58 | 0 | 0 | 11 | 76 |
| TC-7 | polymer 7 | 1.54 | 0 | 0 | 14 | 75 |
| TC-8 | polymer 8 | 1.54 | 0 | 0 | 14 | 76 |
| TC-9 | polymer 9 | 1.55 | 0 | 0 | 15 | 76 |
| TC-10 | polymer 10 | 1.54 | 0 | 0 | 14 | 76 |
| TC-11 | polymer 11 | 1.56 | 0 | 0 | 16 | 70 |
| TC-12 | polymer 12 | 1.56 | 0 | 0 | 15 | 71 |
| TC-13 | polymer 13 | 1.58 | 0 | 0 | 50 | 45 |
| TC-14 | polymer 14 | 1.59 | 0 | 0 | 47 | 48 |
| TC-15 | polymer 15 | 1.57 | 0 | 0 | 16 | 77 |
| TC-16 | polymer 16 | 1.57 | 0 | 0 | 16 | 78 |
| TC-17 | polymer 17 | 1.58 | 0 | 0 | 14 | 79 |
| TC-18 | polymer 18 | 1.58 | 0 | 0 | 14 | 79 |
| Comparative TC-1 | comparative polymer 1 | 1.56 | 0 | 0 | 13 | 71 |

Furthermore, 5 g of a resist polymer, 0.25 g of PAG, and 0.05 g of a quencher shown below were dissolved in 75 g of propylene glycol monoethyl ether acetate (PGMEA), filtered through a 0.2 μm polypropylene filter to prepare a solution of photoresist film composition.

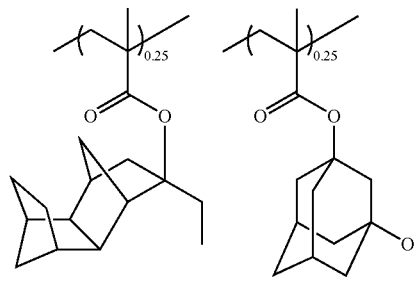

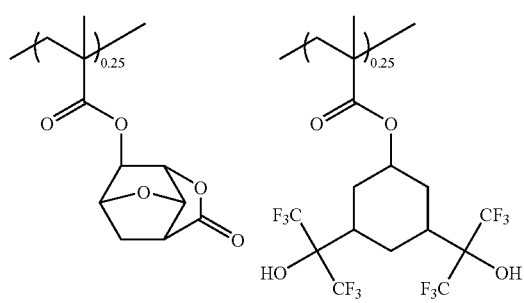

Resist Polymer
Mw; 7,600
Mw/Mn; 1.76

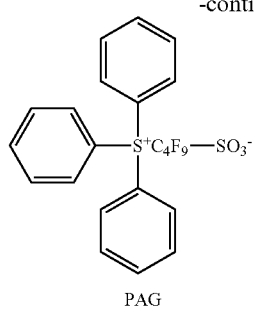

PAG

-continued

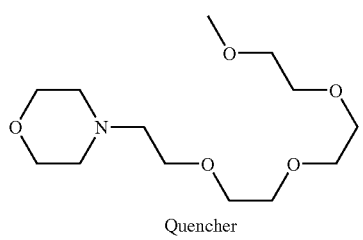

Quencher

Then on each silicon substrate was formed a 87 nm thick antireflection coating ARC-29A manufactured by Nissan Chemical Industries, Ltd.

Subsequently, to each of the silicon substrate on which the antireflection coating was formed was applied the above-prepared photoresist film composition, and baked at 120 degrees C. for 60 seconds to form a photoresist film having a thickness of 150 nm.

Next, to each of the photoresist film was applied resist top coat compositions which were prepared as with above, and baked at 100 degrees C. for 60 seconds to form resist top coats (TC-1 to 19, Comparative TC-1).

Then in order to conduct pseudo liquid immersion exposure, exposed top coats were rinsed with pure water for 5 minutes. That is, the substrates were exposed using the ArF scanner S307E (NA=0.85, σ0.93, 4/5 annular illumination, 6% halftone phase shift mask), rinsed with pure water for 5 minutes, subjected to post exposure bake (PEB) at 110 degrees C. for 60 seconds, and developed for 60 seconds in 2.38 mass % TMAH developer.

On the other hand, also conducted were another process in which the exposure, the pure water rinse, the PEB, and the development were conducted without forming a resist top coat; and a standard process without conducting the pure water rinse after exposure.

Then, each of the silicon substrates was cut and divided, and the pattern profiles of 75 nm line and space and sensitivity of the substrates were compared. Incidentally, an exposure dose that resolves 75 nm line and space in 1:1 was defined as the sensitivity. The results are shown in the following Table 2.

TABLE 2

| Resist Top Coat | Polymers for Resist Top Coat | Sensitivity (mJ/cm²) | 75 nm Pattern Profile |
|---|---|---|---|
| TC-1 | polymer 1 | 30 | rectangle |
| TC-2 | polymer 2 | 30 | rectangle |
| TC-3 | polymer 3 | 30 | rectangle |
| TC-4 | polymer 4 | 30 | rectangle |
| TC-5 | polymer 5 | 30 | rectangle |
| TC-6 | polymer 6 | 30 | rectangle |
| TC-7 | polymer 7 | 30 | rectangle |
| TC-8 | polymer 8 | 30 | rectangle |
| TC-9 | polymer 9 | 30 | rectangle |
| TC-10 | polymer 10 | 30 | rectangle |
| TC-11 | polymer 11 | 30 | rectangle |
| TC-12 | polymer 12 | 30 | rectangle |
| TC-13 | polymer 13 | 30 | rectangle |
| TC-14 | polymer 14 | 30 | rectangle |
| TC-15 | polymer 15 | 30 | rectangle |
| TC-16 | polymer 16 | 30 | rectangle |
| TC-17 | polymer 17 | 30 | rectangle |
| TC-18 | polymer 18 | 30 | rectangle |
| TC-19 | blend of polymer 1 and comparative polymer 1 in 30/70 | 30 | rectangle |
| Comparative TC-1 | comparative polymer 1 | 30 | film loss |
| Process without Top Coat but with Rinse after Exposure | | 32 | T-top |
| Standard Process without Top Coat and Rinse after Exposure | | 31 | rectangle |

As shown in Table 2, the case of conducting the pure water rinse after exposure without a top coat provided T-top pattern profile. This is considered to be caused because generated acid dissolved in water.

On the other hand, in the case of using resist top coats according to the present invention (TC-1 to 19), there occurred no profile deformation.

And, in the case of the resist top coat (Comparative TC-1) in which the polymer did not have an amino group or a sulfonamide group at a polymer end, resist profile after development was film loss profile.

The present invention is not limited to the above-described embodiments. The above-described embodiments are mere examples, and those having the substantially same structure as that described in the appended claims and providing the similar action and advantages are included in the scope of the present invention.

The invention claimed is:

1. A resist top coat composition for forming a top coat on a photoresist film, comprising at least a polymer that has an amino group or a sulfonamide group at a polymer end and that is represented by the following general formula (1):

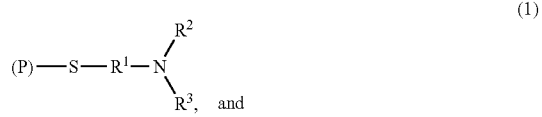

at least one solvent selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether, wherein the (P) represents a unit obtained by polymerization of a polymerizable compound, $R^1$ represents a single bond or a linear, branched or cyclic alkylene group having 1-10 carbon atoms, $R^2$ and $R^3$ independently represent any one of a hydrogen atom, a linear, branched or cyclic alkyl group having 1-20 carbon atoms, and $—SO_2R^4$, either $R^1$ and $R^2$, $R^1$ and $R^3$, or $R^2$ and $R^3$ may be linked to form a ring, $R^4$ represents any one of a linear, branched or cyclic alkyl group having 1-10 carbon atoms and an aryl group having 6-20 carbon atoms, the alkyl group and the aryl group may contain one or more groups selected from an ether group and an ester group, and hydrogen atoms of the alkyl group and the aryl group may be totally or partially substituted with a fluorine atom, the unit (P) of the polymer represented by the general formula (1) comprises a repeating unit represented by the following general formula (2):

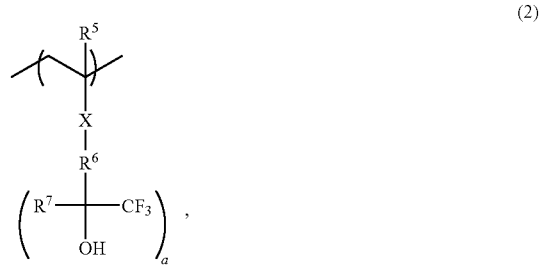

$R^5$ represents any one of a hydrogen atom, a fluorine atom, a methyl group, and a trifluoromethyl group, X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—, $R^{14}$ represents a linear, branched or cyclic alkylene group having 1-10 carbon atoms, $R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom, $R^7$ represents any one of a hydrogen atom, a fluorine atom, a methyl group, a trifluoromethyl group, and a difluoromethyl group, $R^6$ and $R^7$ may be linked to form a ring, and the ring may contain an ether bond, and a is 1 or 2.

2. A patterning process comprising: at least, a step of forming a photoresist film on a substrate; a step of forming a resist top coat on the photoresist film by using the resist top coat composition according to claim 1; a step of exposing the substrate; and a step of developing the substrate with a developer.

3. The patterning process according to claim 2, wherein the step of exposing the substrate is conducted by liquid immersion lithography in which a gap between a projection lens and the substrate is filled with liquid.

4. The patterning process according to claim 3, wherein the step of exposing the substrate is conducted by using a light source having an exposure wavelength in the range of 180 to 250 nm, and using water as the liquid with which the gap between a projection lens and the substrate is filled.

5. The patterning process according to claim 2, wherein the step of developing the substrate is conducted by developing the substrate with an alkaline developer to form a resist pattern on the photoresist film and simultaneously to strip the resist top coat on the photoresist film.

6. A resist top coat composition for forming a top coat on a photoresist film, comprising at least a polymer that has an amino group or a sulfonamide group at a polymer end and that is represented by the following general formula (1):

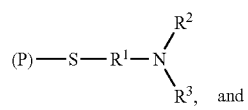

at least one solvent selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether, wherein the (P) represents a unit obtained by polymerization of a polymerizable compound, $R^1$ represents a single bond or a linear, branched or cyclic alkylene group having 1-10 carbon atoms, $R^2$ and $R^3$ independently represent any one of a hydrogen atom, a linear, branched or cyclic alkyl group having 1-20 carbon atoms, and $-SO_2R^4$, either $R^1$ and $R^2$, $R^1$ and $R^3$, or $R^2$ and $R^3$ may be linked to form a ring, $R^4$ represents any one of a linear, branched or cyclic alkyl group having 1-10 carbon atoms and an aryl group having 6-20 carbon atoms, the alkyl group and the aryl group may contain one or more groups selected from an ether group and an ester group, and hydrogen atoms of the alkyl group and the aryl group may be totally or partially substituted with a fluorine atom, the unit (P) of the polymer represented by the general formula (1) comprises a repeating unit represented by the following general formula (3):

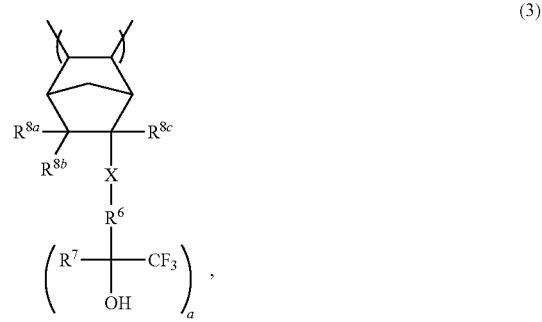

X represents any one of a single bond, $-O-$, $-C(=O)-O-$, $-C(=O)-O-R^{14}$, $-C(=O)-O-$, $-C(=O)-O-R^{14}-O-$, and $-C(=O)-O-R^{14}-O-C(=O)-$, $R^{14}$ represents a linear, branched or cyclic alkylene group having 1-10 carbon atoms, $R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom, $R^7$ represents any one of a hydrogen atom, a fluorine atom, a methyl group, a trifluoromethyl group, and a difluoromethyl group, $R^6$ and $R^7$ may be linked to form a ring, and the ring may contain an ether bond, $R^{8a}$, $R^{8b}$, and $R^{8c}$ independently represent any one of a hydrogen atom, a fluorine atom, a methyl group, and a trifluoromethyl group, and a is 1 or 2.

7. A patterning process comprising: at least, a step of forming a photoresist film on a substrate; a step of forming a resist top coat on the photoresist film by using the resist top coat composition according to claim 6; a step of exposing the substrate; and a step of developing the substrate with a developer.

8. The patterning process according to claim 7, wherein the step of exposing the substrate is conducted by liquid immersion lithography in which a gap between a projection lens and the substrate is filled with liquid.

9. The patterning process according to claim 8, wherein the step of exposing the substrate is conducted by using a light source having an exposure wavelength in the range of 180 to 250 nm, and using water as the liquid with which the gap between a projection lens and the substrate is filled.

10. The patterning process according to claim 7, wherein the step of developing the substrate is conducted by developing the substrate with an alkaline developer to form a resist pattern on the photoresist film and simultaneously to strip the resist top coat on the photoresist film.

11. A resist top coat composition for forming a top coat on a photoresist film, comprising at least a polymer that has an amino group or a sulfonamide group at a polymer end and that is represented by the following general formula (1):

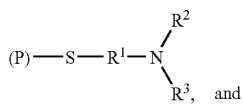

at least one solvent selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether, wherein the (P) represents a unit obtained by polymerization of a polymerizable compound, $R^1$ represents a single bond or a linear, branched or cyclic alkylene group having 1-10 carbon atoms, $R^2$ and $R^3$ independently represent any one of a hydrogen atom, a linear, branched or cyclic alkyl group having 1-20 carbon atoms, and —$SO_2R^4$, either $R^1$ and $R^2$, $R^1$ and $R^3$, or $R^2$ and $R^3$ may be linked to form a ring, $R^4$ represents any one of a linear, branched or cyclic alkyl group having 1-10 carbon atoms and an aryl group having 6-20 carbon atoms, the alkyl group and the aryl group may contain one or more groups selected from an ether group and an ester group, and hydrogen atoms of the alkyl group and the aryl group may be totally or partially substituted with a fluorine atom, the unit (P) of the polymer represented by the general formula (1) comprises a repeating unit represented by the following general formula (5):

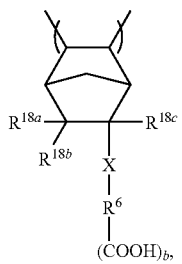

X represents any one of a single bond, —O—, —C(=O)—O—, —C(=O)—O—$R^{14}$— —C(=O)—O—, —C(=O)—O—$R^{14}$—O—, and —C(=O)—O—$R^{14}$—O—C(=O)—, $R^{14}$ represents a linear, branched or cyclic alkylene group having 1-10 carbon atoms, $R^6$ represents a single bond, a linear, branched or cyclic alkylene group or alkanetriyl group having 1-12 carbon atoms, and hydrogen atoms of the alkylene group and the alkanetriyl group may be totally or partially substituted with a fluorine atom, $R^{18a}$, $R^{18b}$, and $R^{18c}$ independently represent any one of a hydrogen atom, a fluorine atom, a methyl group, a trifluoromethyl group, a carboxyl group, and a carboxyl methyl group, and b is 1 or 2.

12. A patterning process comprising: at least, a step of forming a photoresist film on a substrate; a step of forming a resist top coat on the photoresist film by using the resist top coat composition according to claim 11; a step of exposing the substrate; and a step of developing the substrate with a developer.

13. The patterning process according to claim 12, wherein the step of exposing the substrate is conducted by liquid immersion lithography in which a gap between a projection lens and the substrate is filled with liquid.

14. The patterning process according to claim 13, wherein the step of exposing the substrate is conducted by using a light source having an exposure wavelength in the range of 180 to 250 nm, and using water as the liquid with which the gap between a projection lens and the substrate is filled.

15. The patterning process according to claim 12, wherein the step of developing the substrate is conducted by developing the substrate with an alkaline developer to form a resist pattern on the photoresist film and simultaneously to strip the resist top coat on the photoresist film.

16. A resist top coat composition for forming a top coat on a photoresist film, comprising at least a polymer that has an amino group or a sulfonamide group at a polymer end and that is represented by the following general formula (1):

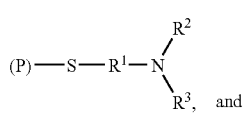

at least one solvent selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether, wherein the (P) represents a unit obtained by polymerization of a polymerizable compound, $R^1$ represents a single bond or a linear, branched or cyclic alkylene group having 1-10 carbon atoms, $R^2$ and $R^3$ independently represent any one of a hydrogen atom, a linear, branched or cyclic alkyl group having 1-20 carbon atoms, and —$SO_2R^4$, either $R^1$ and $R^2$, $R^1$ and $R^3$, or $R^2$ and $R^3$ may be linked to form a ring, $R^4$ represents any one of a linear, branched or cyclic alkyl group having 1-10 carbon atoms and an aryl group having 6-20 carbon atoms, the alkyl group and the aryl group may contain one or more groups selected from an ether group and an ester group, and hydrogen atoms of the alkyl group and the aryl group may be totally or partially substituted with a fluorine atom, the unit (P) of the polymer represented by the general formula (1) comprises a repeating unit represented by the following general formula (6):

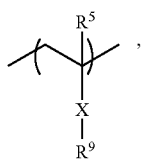

(6)

$R^5$ represents any one of a hydrogen atom, a fluorine atom, a methyl group, and a trifluoromethyl group, X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—, $R^{14}$ represents a linear, branched or cyclic alkylene group having 1-10 carbon atoms, and $R^9$ represents a linear, branched or cyclic primary or secondary alkyl group having 1-20 carbon atoms, and hydrogen atoms of the alkyl group may be totally or partially substituted with a fluorine atom.

17. A patterning process comprising: at least, a step of forming a photoresist film on a substrate; a step of forming a resist top coat on the photoresist film by using the resist top coat composition according to claim 16; a step of exposing the substrate; and a step of developing the substrate with a developer.

18. The patterning process according to claim 17, wherein the step of exposing the substrate is conducted by liquid immersion lithography in which a gap between a projection lens and the substrate is filled with liquid.

19. The patterning process according to claim 18, wherein the step of exposing the substrate is conducted by using a light source having an exposure wavelength in the range of 180 to 250 nm, and using water as the liquid with which the gap between a projection lens and the substrate is filled.

20. The patterning process according to claim 17, wherein the step of developing the substrate is conducted by developing the substrate with an alkaline developer to form a resist pattern on the photoresist film and simultaneously to strip the resist top coat on the photoresist film.

21. A resist top coat composition for forming a top coat on a photoresist film, comprising at least a polymer that has an amino group or a sulfonamide group at a polymer end and that is represented by the following general formula (1):

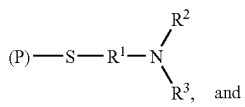

(1)

at least one solvent selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether, wherein the (P) represents a unit obtained by polymerization of a polymerizable compound, $R^1$ represents a single bond or a linear, branched or cyclic alkylene group having 1-10 carbon atoms, $R^2$ and $R^3$ independently represent any one of a hydrogen atom, a linear, branched or cyclic alkyl group having 1-20 carbon atoms, and —$SO_2R^4$, either $R^1$ and $R^2$, $R^1$ and $R^3$, or $R^2$ and $R^3$ may be linked to form a ring, $R^4$ represents any one of a linear, branched or cyclic alkyl group having 1-10 carbon atoms and an aryl group having 6-20 carbon atoms, the alkyl group and the aryl group may contain one or more groups selected from an ether group and an ester group, and hydrogen atoms of the alkyl group and the aryl group may be totally or partially substituted with a fluorine atom, the unit (P) of the polymer represented by the general formula (1) comprises a repeating unit represented by the following general formula (7):

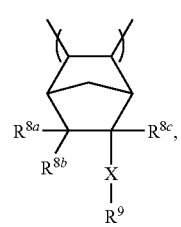

(7)

X represents any one of a single bond, —O—, —C(=O)—O—, —C(=O)—O—$R^{14}$—C(=O)—O—, —C(=O)—O—$R^{14}$—O—, and —C(=O)—O—$R^{14}$—O—C(=O)—, $R^{14}$ represents a linear, branched or cyclic alkylene group having 1-10 carbon atoms, $R^{8a}$, $R^{8b}$, and $R^{8c}$ independently represent any one of a hydrogen atom, a fluorine atom, a methyl group, and a trifluoromethyl group, and $R^9$ represents a linear, branched or cyclic alkyl group having 1-20 carbon atoms, and hydrogen atoms of the alkyl group may be totally or partially substituted with a fluorine atom.

22. A patterning process comprising: at least, a step of forming a photoresist film on a substrate; a step of forming a resist top coat on the photoresist film by using the resist top coat composition according to claim 21; a step of exposing the substrate; and a step of developing the substrate with a developer.

23. The patterning process according to claim 22, wherein the step of exposing the substrate is conducted by liquid immersion lithography in which a gap between a projection lens and the substrate is filled with liquid.

24. The patterning process according to claim 23, wherein the step of exposing the substrate is conducted by using a light source having an exposure wavelength in the range of 180 to 250 nm, and using water as the liquid with which the gap between a projection lens and the substrate is filled.

25. The patterning process according to claim 22, wherein the step of developing the substrate is conducted by developing the substrate with an alkaline developer to form a resist pattern on the photoresist film and simultaneously to strip the resist top coat on the photoresist film.

* * * * *